(12) United States Patent
Hongo et al.

(10) Patent No.: US 7,142,615 B2
(45) Date of Patent: Nov. 28, 2006

(54) DISTORTION COMPENSATOR

(75) Inventors: Naoki Hongo, Tokyo (JP); Yoichi Okubo, Tokyo (JP); Masaki Suto, Tokyo (JP); Masato Horaguchi, Tokyo (JP); Toshio Takada, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 884 days.

(21) Appl. No.: 10/222,783

(22) Filed: Aug. 19, 2002

(65) Prior Publication Data

US 2003/0053552 A1 Mar. 20, 2003

(30) Foreign Application Priority Data

Sep. 18, 2001 (JP) ............................. 2001-283014

(51) Int. Cl.
 *H04L 25/03* (2006.01)
 *H04B 1/04* (2006.01)
(52) U.S. Cl. .................................. 375/297; 455/114.3
(58) Field of Classification Search ................ 375/284, 375/285, 296, 297; 455/43, 114.3
See application file for complete search history.

(56) References Cited

U.S. PATENT DOCUMENTS

| | | | |
|---|---|---|---|
| 5,953,373 A | 9/1999 | Park | |
| 6,108,385 A | 8/2000 | Worley, III | |
| 6,400,781 B1 | 6/2002 | Vandendorpe et al. | |
| 6,477,477 B1 * | 11/2002 | Thron et al. | 702/86 |
| 6,996,378 B1 * | 2/2006 | Helms | 455/91 |
| 2001/0007435 A1 | 7/2001 | Ode et al. | |
| 2002/0118767 A1 * | 8/2002 | Ylamurto | 375/261 |

FOREIGN PATENT DOCUMENTS

| | | |
|---|---|---|
| CN | 1148759 | 4/1997 |
| CN | 1224291 | 6/2004 |
| EP | 0 912 023 | 4/1999 |
| GB | 2 304 007 | 3/1997 |
| JP | 10-290125 | 10/1998 |
| JP | 11-196060 | 7/1999 |
| JP | 2001-505721 | 4/2001 |
| JP | 2001-251148 | 9/2001 |
| JP | 2002-305489 | 10/2002 |
| KR | 157711 | 11/1998 |
| WO | 98/01945 | 1/1998 |
| WO | 00/60732 | 10/2000 |

* cited by examiner

*Primary Examiner*—Jay K. Patel
*Assistant Examiner*—David B. Lugo
(74) *Attorney, Agent, or Firm*—Wenderoth, Lind & Ponack, L.L.P.

(57) ABSTRACT

A distortion compensator for compensating for distortion produced in an amplifier that amplifies a signal includes a signal level detector for detecting a level of a signal to be amplified and a distortion compensator for conducting distortion compensation based on the detection result separately for each frequency band signal of multiple frequency band signals contained in the signal to be amplified. The distortion compensator improves distortion compensation performance by reducing the effect of frequency characteristics that restrict the distortion compensation performance limit.

14 Claims, 17 Drawing Sheets

DISTORTION COMPENSATOR

BACKGROUND OF THE INVENTION

1. Field of the Invention

This invention relates to a distortion compensator for correcting distortion occurring in an amplifier that amplifies transmit signals composed of different frequency carrier signals, an amplifier device equipped with the distortion compensator, a base station equipped with the amplifier device and a relay amplifier station equipped with the distortion compensator. This invention relates particularly to a technology that provides a distortion compensator appropriate for use with carrier signals having mutually different frequencies for improving accuracy of distortion compensation by reducing the effect of frequency characteristics.

2. Description of the Prior Art

In a mobile telecommunications system adopting wideband code-division multiple access (W-CDMA) technology, the base station (CDMA base station) is required to wirelessly transmit signals to reach CDMA mobile stations at remote physical locations. The transmit signals therefore need to be greatly amplified by an amplifier for output at high power.

Since an amplifier is an analog device, however, its input/output characteristics are nonlinear. The effect of this is particularly strong at and beyond the saturation point, known as the amplification limit, where the power of the signal output by the amplifier remains substantially constant irrespective of increase in the power of the input signal. This nonlinear output produces nonlinear distortion.

Therefore, even though signal components outside the desired signal band present in the signal are suppressed to a low level by a band limiting filter before amplification, nonlinear distortion occurs in the signal passed through the amplifier and causes leakage of signal components outside the desired signal band to adjacent channels, for example. The permissible level of such power leakage to adjacent channels is severely regulated in base stations because of their high transmission power. Reduction of adjacent channel leak power (ACP) has therefore become a topic of major interest.

One conventional technology for reducing adjacent channel leak power in a base station is the distortion-compensating transmit power amplification unit that uses a predistortion technique. The structure and operation of units of this type will now be explained.

FIGS. 13 to 16 show the configurations of various distortion-compensating transmit power amplification units utilizing predistortion. Each will be explained separately.

In the transmit power amplification unit of FIG. 13, the transmit signal to be amplified is input to a distortion compensator 41 that predistorts the signal to give it a distortion compensation characteristic. The signal is then amplified and output by a transmit power amplifier unit 42.

The distortion compensation characteristic can, for example, be a characteristic that is the inverse of the nonlinear characteristic occurring in the amplitude-phase plane when the signal is amplified by the amplifier unit 42. The inverse characteristic ordinarily used is that of AM (amplitude modulation)-AM conversion and AM-PM (phase modulation) conversion produced with input signal power as an index. So the distortion compensator 41 is imparted beforehand with distortion whose characteristic is the inverse of the nonlinear characteristic of the amplifier unit 42 with respect to the transmit signal input thereto. The distortion occurring when the transmit signal is amplified in the amplifier unit 42 is therefore corrected so that the signal output by the amplifier unit 42 is the input signal amplified without distortion.

The distortion compensator 41 is, for example, constituted using a diode or the like having the distortion compensation characteristic.

In the transmit power amplification unit shown in FIG. 14, the transmit signal to be amplified is input to a distortion compensator 51 and a power detector 53. The power detector 53 detects the power of the signal and outputs the detection result to a controller 54. The controller 54 controls the distortion compensator 51 to distort the signal to have a distortion compensation characteristic based on the power detection result. The signal imparted with distortion by the distortion compensator 51 in accordance with the control signal from the controller 54 is amplified by an amplifier unit 52.

When the signal input to the distortion compensator 51 is analog, the distortion compensator 51 is configured using an attenuator (ATT) for attenuating the signal and a phase shifter for shifting the signal phase. When the input signal is digital, the distortion compensator 51 is configured using a vector arithmetic unit for changing the amplitude and phase of the digital signal.

The power detector 53 can use any of various methods for detecting the signal power, including, for example, envelope detection or a method that uses a processor to conduct processing equivalent to envelope detection.

The controller 54 is can be configured using a digital signal processor (DSP) and is provided with a lookup table (LUT) regarding AM-AM conversion and AM-PM conversion for imparting distortion with a distortion compensation characteristic. When the signal input to the transmit power amplification unit of FIG. 14 is analog, the controller 54 supplies the distortion compensator 51 with information for controlling the attenuator and information for controlling the phase shifter as appropriate for the power of the input signal. When the input signal is digital, the controller 54 supplies the distortion compensator 51 with compensation vector information appropriate for the power of the input signal.

Further, when the signal input to transmit power amplification unit of FIG. 14 is analog, the controller 54 is equipped with an analog-to-digital (A/D) converter for digitizing the power detection result it receives as an analog signal from the power detector 53 and with an digital-to-analog (D/A) converter for converting control signals for the distortion compensator 51 from digital to analog and outputting them to the distortion compensator 51.

The transmit power amplification unit shown in FIG. 15 includes a distortion compensator 61, amplifier unit 62, power detector 63 and controller 65, which function like their counterparts in FIG. 14, plus a demodulator 64 that forms a feedback loop. In this transmit power amplification unit, the transmit signal input to the distortion compensator 61 and power detector 63 is also input to the controller 65, and part of the signal output by an amplifier unit 62 is input to the demodulator 64. The demodulator 64 orthogonally demodulates this portion of the signal and sends the orthogonal demodulation result to the controller 65.

Further, in this transmit power amplification unit, the controller 65 compares the transmit signal and the orthogonal demodulation result, detects the distortion component produced in the amplifier unit 62, and updates the lookup table so as to reduce the detected distortion component. The updating of the lookup table makes it possible, for example, to adapt to changes in the nonlinear characteristic of the amplifier unit 62 caused by aging, temperature change or the like. In other words, the transmit power amplification unit is capable of adaptive predistortion.

The transmit power amplification unit shown in FIG. 16 includes a distortion compensator 71, amplifier unit 72, power detector 73 and controller 75, which function like their counterparts in FIG. 14, plus a filter unit 74 that forms a feedback loop. In this transmit power amplification unit, part of the signal output by an amplifier unit 72 is input to the filter unit 74. The filter unit 74 extracts from this signal portion only the signal component in the band in which the distortion component produced in the amplifier unit 72 is leaked and sends the extracted distortion component to the controller 75.

Further, in this transmit power amplification unit, the controller 75 updates the lookup table so as to reduce the input distortion component thereto. The updating of the lookup table makes it possible, for example, to adapt to changes in the nonlinear characteristic of the amplifier unit 72 caused by aging, temperature change or the like. In other words, the transmit power amplification unit is capable of adaptive predistortion.

Then filter unit 74 can be constituted using a band pass filter (BPF) or mixer and variable frequency oscillator.

Prior art technologies related to distortion compensation of wideband signals will now be discussed.

Examined Japanese Patent Publication JP-B-7-101819 (Reference No. 1) teaches a "Distortion compensation circuit in a multifrequency simultaneous amplifier." In this technology, when a composite signal obtained by synthesizing multiple different frequency RF input signals is amplified using a wideband low-distortion amplifier, a distortion component of the frequency of a calculated spurious component is detected from the amplified signal and a distortion component occurring in the composite signal is controlled to minimize the detected distortion component.

One difference between this technology and the present invention described in the following is that Reference No. 1 is silent regarding control of distortion compensation based on input signal level.

Unexamined Japanese Patent Publication JP-A-2000-223961 (Reference No. 2) teaches a "Feed-forward amplifier and amplification method." In this technology, signals in different frequency bands are separately compensated for distortion by respective predistortion circuits, the distortion-compensated signals of all frequency bands are synthesized, the synthesized signal is amplified by a main amplifier, the distortion component produced by the main amplifier is detected by the feed-forward method, and the detected distortion component is removed from the amplified signal.

One difference between this technology and the present invention described in the following is that Reference No. 2 is silent regarding control of distortion compensation based on input signal level.

As is can be seen from the foregoing examples of the prior art, various distortion-compensating power amplifier configurations have been considered.

However, in the prior art distortion compensation configurations, such as illustrated in FIGS. 14 to 16, the distortion compensation characteristic, i.e., the AM-AM conversion and AM-PM conversion relative to the input signal power, is not uniform owing to the difference between the frequency characteristic present during the period the input signal passes through the distortion compensator and is output from the amplifier unit and frequency characteristic present in the power detector. The distortion compensation performance is therefore limited.

This disadvantage will be explained more specifically with reference to the graph of FIG. 17.

In FIG. 17, the curve (a) shows an example of the frequency characteristic of the amplitude of a signal input to the distortion compensator and the curve (b) shows an example of the frequency characteristic of the amplitude of the signal output from the amplifier unit (AMP) in this case. (The horizontal axis of the graph represents frequency and the vertical axis gain.)

As the graph shows, even if the frequency characteristic of input signal amplitude is linear, the frequency characteristic of the amplitude of the signal output by the amplifier unit is not linear but nonlinear. This nonlinearity arises owing to the frequency characteristics of the various components of the amplifier unit, such as the drive amplifier and the power amplifier unit. Owing to this nonlinearity, the power of the transmit signal input to the distortion compensator and the power of the signal input to the power amplifier that produces the distortion come to differ, making it impossible to carry out accurate distortion compensation.

Particularly in a base station adopting W-CDMA, the transmit signal amplified in the amplifier unit may contain multiple carrier signals differing in frequency. Since in such a case the frequency band of the signal to be amplified becomes still broader, the frequency characteristics appear strongly to make it impossible to eliminate their effect and perform accurate distortion compensation.

The graph of FIG. 17 illustrates only an example of amplitude frequency characteristic. The phase and other frequency characteristics are also nonlinear.

The "Feed-forward amplifier and amplification method" taught by Reference No. 2 can be considered to conduct distortion compensation using a separate predistortion circuit for the signal of each frequency band. Reference No. 2 is, however, silent regarding the point of how to control this kind of distortion compensation. If such distortion compensation is to actually operate effectively, consideration must be given to the means used to implement such control.

In other words, while Reference No. 2 can be understood to effect distortion compensation using multiple predistortion units for the respective signals of the frequency bands included in a wideband signal, it leaves untouched the matter of how the predistortion unit should be controlled. In contrast, the present invention, as explained below, focuses attention on this point. Specifically, the present invention reflects the thinking that simplification of the control configuration, ease of implementation of the control configuration, and improved control accuracy can better be achieved by control with consideration to the power level of a signal combining the signals of the multiple frequency bands, i.e., the signal to be amplified, than by control with consideration to the power level of the individual signals of frequency bands corresponding to the predistortion units.

The present invention was accomplished in light of the foregoing problems of the prior art and has as an object to provide a distortion compensator that compensates for distortion occurring in an amplifier that amplifies a signal while conducting control based on the level of the signal to be amplified and is characterized in that it improves distortion compensation performance by reducing the effect of frequency characteristics that restrict the distortion compensation performance limit.

SUMMARY OF THE INVENTION

The present invention achieves this object by providing a distortion compensator for compensating for distortion produced in an amplifier that amplifies a signal comprising a signal level detection means for detecting a level of a signal to be amplified and distortion compensation means for conducting distortion compensation based on the detection result separately for each frequency band signal of multiple frequency band signals contained in the signal to be amplified.

Therefore, since distortion compensation is conducted separately for each frequency band signal of multiple frequency band signals contained in the signal to be amplified, even if the signal to be amplified is a wideband signal, the effect of frequency characteristics on the distortion compensation can be reduced. Moreover, since distortion compensation is conducted separately for each frequency band signal based on the overall level of the signal to be amplified (the object signal), distortion compensation can be achieved with good accuracy by a simple configuration. Owing to these advantages, the distortion compensation performance is enhanced.

When a signal to be amplified contains signals in multiple frequency bands, it is extremely difficult in actual practice to detect the level of the power, etc. of the individual frequency band signals and conduct distortion compensation based on the detection results. In this invention, therefore, distortion compensation is conducted separately for each frequency band based on the level of the composite power, etc. of the multiple frequency bands, i.e., the overall level of the signal to be amplified. As it is the whole of the object signal that is amplified by the amplifier, this method of the invention provides a marked improvement in the distortion compensation performance.

"Frequency band" as termed with respect to the present invention includes a frequency band with no width, i.e., a frequency whose value falls at a single point.

The signal to be amplified (object signal) can be any of various kinds of signals and the invention is suitable for application to wideband signals such as multicarrier transmit signals.

When the object signal is a multicarrier signal, preferably the frequency band of the multicarrier signal is divided into the individual carrier frequencies and distortion compensation is conducted for each of the divided frequency bands. A single divided frequency band can, however, contain multiple carriers. In other words, all that is required is that distortion compensation be conducted with respect to each frequency band obtained by dividing the frequency band of the object signal. In this invention, distortion compensation is conducted separately with respect to each of two or more divided frequency bands using as an index the level of the object signal in its state before frequency band division, e.g., the level of the overall power of the object signal.

The frequency band of the object signal input to the to the distortion compensator is not particularly limited and the signal can, for example, be a radio frequency (RF) band signal, an intermediate frequency (IF) band signal, a baseband (BB) signal or any of various other frequency band signals.

The object signal input to the distortion compensator can, for example, be an analog signal subjected to orthogonal modulation or to be subjected to orthogonal modulation or a digital signal composed of complex signal having an I component and a Q component. Correspondingly, the distortion compensation can, for example, utilize analog processing such as analog predistortion or digital processing such as digital predistortion.

The method adopted for conducting distortion compensation can be any of various methods. Such methods include, for example, a method that uses an attenuator (ATT) and a phase shifter to impart amplitude distortion and phase distortion to an analog signal, and a method that uses a complex multiplier to multiply a digital signal by a vector having an inverse distortion characteristic. Other usable methods include that of using an unalterable table that unalterably stores information for controlling distortion compensation processing and a method that conducts adaptive predistortion using a feedback loop to update information for controlling distortion compensation processing.

Any of various types of amplifiers can be used and it is possible to use either a single amplifier or a plurality of amplifiers.

While the degree to which the distortion produced in the amplifier is compensated for is preferably such that the distortion is reduced to zero, any degree of distortion compensation accuracy that is practically effective can be adopted.

The level detected by the signal level detection means can be any of various levels and, for example, can be a power level or an amplitude level.

The level detection by the signal level detection means can be conducted with respect to signals in any of various frequency band states and, for example, the level detection can be conducted with respect to signals in the RF band, the IF the BB band or the like.

Thus, in the present invention, the signal to be amplified (object signal) is a signal containing multiple frequency band signals and distortion compensation is conducted separately for each frequency band signal. The effect of the frequency characteristics on the distortion compensation can therefore be reduced relative to the case of blanket distortion compensation of the whole object signal because the distortion compensation is carried out with respect to frequency bands of narrow width.

Since the distortion produced in an amplifier when it amplifies a signal ordinarily varies with the level of the signal, this invention is adapted to upgrade the distortion compensation accuracy by conducting the distortion compensation based on the level detection result.

In one preferred configuration, the invention provides a distortion compensator further comprising frequency band division means for dividing the signal to be amplified into multiple frequency band signals and frequency band combining means for combining multiple frequency band signals compensated for distortion by the distortion compensation means and outputting the combination result to the amplifier, wherein the signal level detection means detects the level of the input signal for amplification and the distortion compensation means is constituted to include multiple predistortion means for generating distortion for each frequency band signal divided by the frequency band division means and predistortion control means for controlling generation of distortion by the predistortion means based on the detection result of the signal level detection means.

Distortion compensation by predistortion can therefore be conducted separately for each frequency band signal contained in the object signal and, after the distortion compensation, the plurality of frequency band signals can be combined and the combination result (composite signal) output to the amplifier. When the composite signal input to the amplifier is amplified, the distortion generated by the predistortion means (PD) and the distortion produced in the amplifier cancel each other to reduce the overall distortion to zero or nearly zero.

The number of the multiple frequency band signals into which the object signal is divided can be any of various numbers. Ordinarily, it can be considered that the effect of the frequency characteristics on the distortion compensation can be decreased in proportion as this number is increased.

The division into multiple frequency band signals can, for example, be division into multiple frequency band signals of the equal bandwidth.

In this invention, the plurality of divided signals can, for example, be combined to restore them to a signal having the same frequency band as before the division.

The number of the plurality of predistortion means is not particularly limited and can, for example, be the same number as the number of divided signals.

When the object signal is a transmit signal for wireless transmission from an antenna, the composite signal output from the frequency band combining means to the amplifier is ordinarily an RF band composite signal.

The invention distortion compensator described in the foregoing can be configured to convert the frequency band of the object signal in a frequency band combiner, for example. By this, the signals to be processed in the different processing sections can each be processed as a frequency band signal appropriate for the processing concerned.

To give an example, in the invention distortion compensator configured as described in the foregoing, the frequency band combining means can utilize distortion-compensated signal frequency band converting means to convert each of the frequency band signals distortion-compensated by the distortion compensation means to a different frequency band signal and then combine the multiple frequency band signals obtained by the conversion and output the combination result to the amplifier.

Or, to give another example, in the invention distortion compensator configured as described in the foregoing, the frequency band signals distortion-compensated by the distortion compensation means can be combined by the frequency band combining means, the combination result be converted to a different frequency band signal by distortion-compensated signal frequency band converting means, and the signal obtained by the conversion output to the amplifier.

In another preferred configuration, the invention provides a distortion compensator further comprising input signal combining means for combining multiple signals corresponding to multiple frequency bands input for amplification and frequency band combining means for combining the multiple signals corresponding to multiple frequency bands distortion-compensated by the distortion compensation means and outputting the combination result to the amplifier, wherein the signal level detection means detects the level of the combination result signal produced by the input signal combining means, and the distortion compensation means is constituted to include multiple predistortion means for generating distortion for each signal corresponding to a frequency band input for amplification and predistortion control means for controlling generation of distortion by the predistortion means based on the detection result of the signal level detection means.

Therefore, when multiple signals corresponding to multiple frequency bands are input for amplification, the distortion compensation can be controlled based on the level of the composite signal obtained by combining the multiple signals and, after distortion compensation, the multiple signals can be combined and the composite signal be output to the amplifier.

The multiple signals corresponding to multiple frequency bands can, for example, be different frequency band signals or, as explained below, be same frequency band signals at the time they are input.

Specifically, in another preferred configuration, the invention provides a distortion compensator in which multiple signals corresponding to multiple frequency bands input for amplification are input as same frequency band signals, the input signal combining means includes input signal frequency band converting means that converts the input signal corresponding to each frequency band to a different frequency and then combines the multiple frequency band signals obtained by the conversion, and the frequency band combining means includes distortion-compensated signal frequency band converting means that converts the signal corresponding to each frequency band distortion-compensated by the distortion compensation means to a different frequency band signal, combines the multiple frequency band signals obtained by the conversion and outputs the combination result to the amplifier.

Therefore, when multiple signals corresponding to multiple frequency bands are input as same frequency band signals for convenience in signal processing or the like, the distortion compensation can be conducted based on the level of the composite signal obtained by combining the multiple signals, and the composite signal obtained by combining the multiple signals after distortion compensation can be output to the amplifier.

On the other hand, when multiple signals corresponding to multiple frequency bands are signals differing frequency from one another, a configuration can be adopted in which signal frequency band is up-converted in a frequency band combiner.

To give an example, the invention provides a distortion compensator in which the multiple signals corresponding to multiple frequency bands input for amplification are each input as a different frequency band signal and the frequency band combining means includes distortion-compensated signal frequency band converting means that converts the signal corresponding to each frequency band distortion-compensated by the distortion compensation means to a different frequency band signal, combines the multiple frequency band signals obtained by the conversion and outputs the combination result to the amplifier.

To give another example, the invention provides a distortion compensator in which the multiple signals corresponding to multiple frequency bands input for amplification are each input as a different frequency band signal and the frequency band combining means combines the signals corresponding to the frequency bands distortion-compensated by the distortion compensation means, includes distortion-compensated signal frequency band converting means that converts the combination result to a different frequency band signal, and outputs the signal obtained by the conversion to the amplifier.

In another preferred configuration, the invention provides a distortion compensator that conducts digital processing. In this distortion compensator, which includes orthogonal modulation means, each predistortion means outputs as signals imparted with distortion a digital signal having an I component and a digital signal having a Q component, the orthogonal modulation means generates from the I component digital signal and the Q component digital signal output by each predistortion means an analog signal constituting the result of orthogonal modulation, and the frequency band combining means acquires a combination result with respect to the multiple analog signals corresponding to the multiple predistortion means generated by the orthogonal modulation means and outputs the combination result to the amplifier.

Therefore, when the signal input for amplification is composed of an I component digital signal and a Q component digital signal, distortion compensation is effected by digital processing and the distortion-compensated composite signal is output to the amplifier as an analog signal.

This configuration of a distortion compensator that conducts digital predistortion and the like is considered particularly effective from the viewpoint of cost, circuit scale and other points regarding implementation of the invention.

Methods usable for generating the analog signal constituting the result of orthogonal modulation from the I component signal and the Q component signal include, for example, the method of converting the I component signal and the Q component signal to analog signals that are thereafter subjected to analog orthogonal modulation, and the method of subjecting the I component digital signal and the Q component digital signal to digital orthogonal modulation and thereafter analogizing the digital orthogonal modulation results.

In another preferred configuration, the invention provides a distortion compensator that conducts adaptive predistortion. In this distortion compensator, which includes signal demodulation means for demodulating from the signal output by the amplifier a signal corresponding to the signal to be amplified, the predistortion control means includes control scheme memory means that stores the signal level and the control scheme of the predistortion means in association with each other and controls generation of distortion by the predistortion means in a control scheme associated with the detection result of the signal level detection means based on the content of the control scheme memory means, and the predistortion control means further includes distortion detection means that detects distortion produced in the amplifier from the signal to be amplified and the signal demodulated by the signal demodulation means and control scheme memory content change means that changes the content of the control scheme memory means to reduce the distortion detected by the distortion detection means.

A distortion compensator that conducts distortion compensation separately for each frequency band signal contained in the signal to be amplified based on the overall level of the signal to be amplified is therefore provided that updates the association between the signal level and the control scheme so as to reduce the distortion contained in the signal output by the amplifier. Accurate distortion compensation is therefore ensured even if the nonlinear characteristic of the amplifier should change owing to aging, temperature change or the like.

The signal output by the amplifier used for the signal demodulation is ordinarily obtained by dividing off part of the signal output by the amplifier. The remaining part of the signal output by the amplifier is forwarded to downstream processing sections.

The signal corresponding to the signal to be amplified is a demodulated signal of the same frequency band as the signal to be amplified (object signal). In this case, the demodulated signal contains the distortion produced in the amplifier, while the object signal prior to amplification does not contain the distortion. The distortion produced in the amplifier can therefore be detected from these two signals.

The control scheme memory means can be a memory device for storing information.

The association between the signal level and the control scheme of the predistortion means can, for example, be an association between the signal level detected by the signal level detection means and the control scheme used to control the predistortion control means when that signal level is detected.

The scheme used to reduce the distortion detected by the distortion detection means is preferably a scheme that minimizes the distortion but can instead be any of various other schemes that are practically effective.

Methods usable for changing the content of the control scheme memory means include, for example, a mode that rewrites information stored in the memory.

The mode of rewriting information can be a mode that rewrites all of the stored information or a mode that rewrites part of the stored information.

To give an example, the invention provides a distortion compensator in which the signal demodulation means separately demodulates the frequency band signal corresponding to each predistortion means, the distortion detection means detects the distortion produced in the amplifier with respect to each frequency band signal demodulated by the signal demodulation means, and the control scheme memory content change means separately changes the portion of the information stored in the control scheme memory means corresponding to each frequency band signal demodulated by the signal demodulation means.

Therefore, since the portion of the information stored in the control scheme memory means corresponding to each predistortion means frequency band is separately changed, high-accuracy distortion compensation can be achieved.

Methods usable for separately demodulating the frequency band signal corresponding to each predistortion means include the method of separately demodulating the individual frequency band signals simultaneously using a plurality of demodulators and the method of separately demodulating the frequency band signals by time-shared demodulation using a single demodulator.

The separate demodulation of the frequency band signal corresponding to each predistortion means is preferably demodulation of a signal having the same frequency band as the frequency band processed by the predistortion means.

In another preferred configuration for adaptive predistortion, the invention provides a distortion compensator that further includes distortion extracting means for extracting distortion produced in the amplifier from a signal output by the amplifier, wherein the predistortion control means includes control scheme memory means, the predistortion control means includes control scheme memory means that stores the signal level and the control scheme of the predistortion means in association with each other and controls generation of distortion by the predistortion means in a control scheme associated with the detection result of the signal level detection means based on the content of the control scheme memory means, and the predistortion control means further includes control scheme memory content change means that changes the content of the control scheme memory means to reduce the distortion extracted by the distortion extracting means.

A distortion compensator that conducts distortion compensation separately for each frequency band signal contained in the signal to be amplified based on the overall level of the signal to be amplified is therefore provided that updates the association between the signal level and the control scheme so as to reduce the distortion contained in the signal output by the amplifier. Accurate distortion compensation is therefore ensured even if the nonlinear characteristic of the amplifier should change owing to aging, temperature change or the like.

The signal output by the amplifier used for the distortion extraction is ordinarily obtained by dividing off part of the signal output by the amplifier. The remaining part of the signal output by the amplifier is forwarded to downstream processing sections.

As the distortion extracting means can be used, for example, at least one filter that extracts a prescribed frequency band signal.

Similarly to what was explained earlier, the mode of changing information stored in the control mode memory means can be a mode that changes all of the stored information or a mode that changes part of the stored information.

To give an example, the invention provides a distortion compensator in which the distortion extracting means separately extracts the distortion of the frequency band corresponding to each predistortion means and the control scheme memory content change means separately changes the portion of the information stored in the control scheme memory means corresponding to the distortion of each frequency band extracted by the distortion extracting means so as to reduce the distortion of each frequency band.

Therefore, since the portion of the information stored in the control scheme memory means corresponding to each predistortion means frequency band is separately changed, high-accuracy distortion compensation can be achieved.

Methods usable for separately extracting the distortion of the frequency band corresponding to each predistortion means include the method of separately extracting the distortion of the individual frequency bands simultaneously using a plurality of filters and the method of separately extracting the distortion of the individual frequency bands by time-shared extraction using a single filter.

The separate extraction of the distortion of the frequency band corresponding to each predistortion means is preferably extraction of distortion of a frequency band that is on the lower frequency side relative to the signal to be amplified in the frequency band processed by each predistortion means and contains many distortion components or extraction of distortion of a frequency band that is on the higher frequency side relative to the signal and contains many distortion components.

The distortion compensator described in the foregoing is suitable for application to a telecommunications device provided in a base station or relay amplifier station used in a mobile telecommunications system such as a mobile phone system or a personal handy phone system (PHS).

Thus, in one aspect, the present invention provides a telecommunications device used in a mobile telecommunications system which comprises a distortion compensator and uses the distortion compensator to compensate for distortion produced in an amplifier for amplifying a carrier signal to be transmitted.

The telecommunication system used by the telecommunications device can be any of various telecommunications systems. The present invention is applicable to various technologies, including not only W-CDMA and CDMA but also time division multiple access (TDMA) and frequency division multiple access (FDMA).

An example of the distortion compensation by individual frequency band according to the present invention will now be explained in detail with reference to FIG. 11.

The explanation will be made with regard to the case of applying the present invention to a distortion-compensating transmit power amplification unit such as shown in FIG. 14 discussed earlier.

In this invention, the instantaneous total power level of the transmit signal for amplification by the distortion compensating transmit power amplification unit is measured or calculated, a control amount for distortion compensation appropriate for the total power level is acquired based on the distortion compensation characteristic of each signal divided by frequency band, an attenuator and phase shifter combination, a vector arithmetic unit or the like is used to impart distortion having a distortion compensation characteristic (inverse distortion characteristic) separately to each signal divided by frequency band in accordance with the acquired control amount and the multiple signals imparted with the distortion compensation characteristics are combined and output to the amplifier unit. As a result, the nonlinear distortion produced in the amplifier unit and the distortion with distortion compensation characteristic cancel each other in the amplifier unit output to reduce distortion produced by the amplifier unit.

Thus, in this invention, since distortion compensation is conducted separately with respect to each frequency band signal obtained by frequency band division of the transmit signal, the effect of frequency characteristics, such as the amplitude characteristics, phase characteristics and phase modulation characteristics that differ among the individual frequency bands, can be reduced or most favorably eliminated, thereby enhancing the accuracy of the distortion compensation.

To cite a specific example, when in FIG. 1 the frequency characteristic up to the output of the amplifier unit 4 can be considered to be linear, the distortion compensation characteristic is the same for every divided frequency band and, further, the addition rule regarding multiple frequency band signals holds, so that when the signals separately compensated for distortion by individual frequency band are combined, the signal input to the amplifier unit 4 in FIG. 1 becomes the same as the signal input to the amplifier unit 52 in FIG. 14.

To cite another specific example, when in FIG. 1 the frequency characteristic up to the output of the amplifier unit 4 is not linear but nonlinear, difference in phase and/or gain characteristics may arise among the functions that conduct the distortion compensation with respect to the individual divided frequency bands. In this case, therefore, separate AM-AM conversion and AM-PM conversion inverse characteristics are used as the distortion compensation characteristics of the individual functions that conduct the distortion compensation separately with respect to the individual frequency bands.

The graphs of FIGS. 11(a) to 11(d) show examples of AM-AM conversion-related inverse distortion characteristics regarding functions that conduct distortion compensation of mutually different divided frequency bands f1, f2, f3, fn (where n is 4 or greater; and f1–fn indicate the center frequencies of the divided frequency bands). The horizontal axes of the graphs in FIGS. 11(a) to 11(d) represent the level of the total power of the transmit signal to be amplified and the vertical axes represent amplitude control amount. As shown by these graphs, a different distortion compensation characteristic (inverse distortion characteristic) is used for each frequency band f1, f2, f3, fn, namely, the distortion compensation characteristic used for each of the frequency bands f1, f2, f3, fn is one suitable for reducing the effect of frequency characteristics of that frequency band.

In multicarrier transmission, a signal obtained by synthesizing multiple carrier signals corresponding to multiple frequencies is transmitted. This signal becomes the object signal of the amplification. The power level of the synthesized signal is represented on the horizontal axes of the graphs of FIG. 11(a) to 11(d). Distortion compensation is conducted based on the power of the synthesized signal separately for each divided frequency band based on the power of the synthesized signal so as to compensate for the distortion produced when the synthesized signal is amplified by the amplifier.

An example of the state of the frequency bands at the time of input of the input signal to the distortion compensator of the present invention will now be explained with reference to FIG. 12.

When the power level of the whole object signal is to be detected or when the distortion-compensated signal is to be output to the amplifier, it is, as shown by the signals in FIG. 12(*a*), necessary for the multiple signals corresponding to the multiple frequency bands to have mutually different frequency bands f1, f2, . . . fm (where m is three or greater; and f1 –fn indicate the center frequencies of the frequency bands). The horizontal axes of the graphs in FIG. 12(*a*)–12(*d*) represent frequency (f) and each graph exemplifies the signal spectra.

With regard to the foregoing, when, as shown in FIG. 12(*b*), multiple signals corresponding to multiple bands are input as signals of mutually different frequency bands f1, f2, f3, . . . a signal like that shown in FIG. 12(*a*) can be obtained by combining the multiple signals. However, when, as shown in FIG. 12(*c*), multiple signals corresponding to multiple frequency bands are input as signals of the same frequency band f1' (where f1' indicates the center frequency of the frequency band), a signal like that shown in FIG. 12(*a*) cannot be obtained simply by combining the signals as they are.

Therefore, when signals like those shown in FIG. 12(*c*) are input, the signals must, as shown in FIG. 12(*d*), be up-converted to put the signals corresponding to the respective frequency bands in mutually different frequency bands, i.e., to frequency-convert the frequency bands of the signals corresponding to the respective frequency bands to mutually different frequency bands f1', f2', f3' . . . (where, like f1', f2', f3' . . . also indicate the center frequency of the frequency band). The probability of this situation arising can be considered to be high when IF band signals or BB band signals are input as the signal to be amplified. The mutually different frequency bands f1', f2' f3' . . . used can be freely selected from among any of various frequency bands, including, for example, frequency bands with center frequencies of 0, 5, 10, 15 . . . [MHz], frequency bands with center frequencies of 90, 95, 100, 105 . . . [MHz], and frequency bands with center frequencies of 2.1125, 2.1175, 2.1225, 2.1275 . . . [MHz].

The power level of a composite signal detected when multiple signals corresponding to multiple frequency bands are combined as signals of the same frequency band and the power level of a composite signal detected when the signals are converted to mutually different frequency band in the foregoing manner are ordinarily different.

Thus, when signals of what were originally different frequency bands f1–fm are input as signals of the same frequency band at the stage of distortion compensation, it is necessary, as explained earlier, to provide the input signal combining means or the frequency band combining means with frequency band converting means. To the contrary, when the signals of mutually different frequency bands f1–fm are input as they are in their mutually different frequency bands, provision of frequency band converting means is not absolutely necessary.

DESCRIPTION OF THE PREFERRED EMBODIMENTS

Embodiments of the present invention will now be explained with reference to the drawings.

The following embodiments are explained with regard to examples in which the distortion compensator of the invention is installed in an amplifier device. The amplifier device discussed with regard to each embodiment is one installed in a base station or the like for conducting W-CDMA or other such wireless telecommunications, where it is used to amplify multicarrier transmit signals. The distortion compensator of this invention compensates for the distortion produced in the amplifier unit of the amplifier device at this time.

In the embodiments that follow, n is defined as 2 or greater.

An amplifier device incorporating a first embodiment of the present invention will now be explained.

Figure 1:
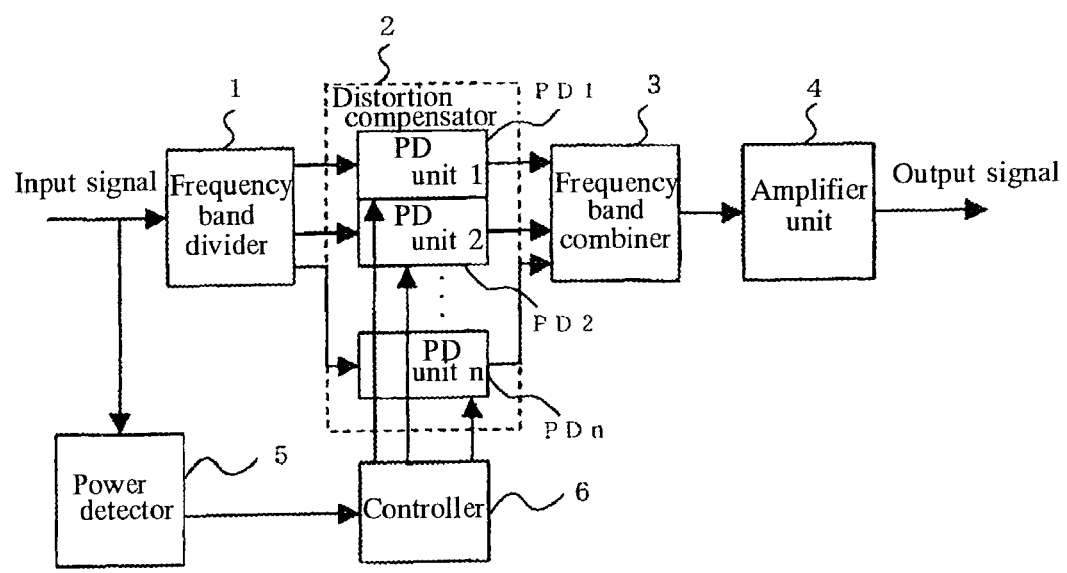
FIG. 1 is a block diagram showing the configuration of an amplifier device incorporating a first embodiment of the present invention.

FIG. 1 is a block diagram showing the configuration of the amplifier device. The amplifier device comprises a frequency band divider 1, a distortion compensator 2 having n number of predistortion (PD) units PD1–PDn, a frequency band combiner 3, an amplifier unit 4, a power detector 5 and a controller 6.

In this embodiment, the multicarrier transmit signal to be amplified is input to the frequency band divider 1 and the power detector 5.

The frequency band divider 1 divides the input transmit signal into signals of n number of frequency bands f1–fn (where f1–fn indicate the center frequencies of the divided frequency bands: hereinafter the same). The signals of the divided frequency bands f1–fn are output to the predistortion units PD1–PDn corresponding to the frequency bands f1–fn. The frequency band divider 1 is constituted using band pass filters for extracting the signals of the frequency bands f1–fn or a processor capable achieving an equivalent function by signal processing. Preferably, the n number of frequency bands f1–fn correspond to the carrier frequencies contained in the multicarrier transmit signal.

The predistortion units PD1–PDn provided in the distortion compensator 2 impart distortion separately to each of the signals of the divided frequency bands f1–fn received from the frequency band divider 1 in accordance with control signals input from the controller 6, explained later, thereby conducting distortion compensation by predistortion. The distortion-compensated signals of the divided frequency bands f1–fn are individually output to the frequency band combiner 3.

The frequency band combiner 3 combines the multiple signals input from the multiple predistortion units PD1–PDn provided in the distortion compensator 2 and outputs the composite signal to the amplifier unit 4. The composite signal has the same frequency band as the frequency band of the signal input to the frequency band divider 1 and, in this embodiment, has the frequency band obtained by combining the divided frequency bands f1–fn. The frequency band combiner 3 is constituted using a coupler or a processor capable of achieving an equivalent function by signal processing.

The amplifier unit 4 amplifies the composite signal input from the frequency band combiner 3 and outputs the amplified signal to an antenna system (not shown) or the like.

The power detector 5 detects the level of the power of the input transmit signal by, for instance, envelope detection and outputs the detection result to the controller 6.

The controller 6 has a memory containing a lookup table storing signal power detection results input from the power detector 5 in association with control information for controlling the predistortion units PD1–PDn. The controller 6 reads the control information associated with the detection result input from the power detector 5 from the lookup table and outputs control signals representing the control information to the predistortion units PD1–PDn. The control information is defined so that when a signal of a power associated with the control information is input, the predistortion units PD1–PDn impart distortion to the signal that has the inverse characteristic of the distortion produced in the amplifier.

For convenience of explanation, as shown in FIG. 1, this embodiment is configured so that the number of control signals the controller 6 outputs to the predistortion units PD1–PDn is the same number n as the number of divided frequency bands. It is, however, possible instead to utilize other configurations such as one in which the controller 6 sends the distortion compensator 2 a single control signal representing information for controlling n number of predistortion units PD1–PDn.

As explained in the foregoing, in this embodiment of the amplifier device, when multiple carrier signals of different frequency are input as the transmit signal, the compensation for distortion produced in the amplifier unit 4 when the transmit signal is amplified is conducted with reference to the power of the transmit signal as an index by carrying out the distortion compensation separately with respect to each of two or more frequency bands into which the transmit signal has been divided.

In the amplifier device of this embodiment, therefore, since the distortion compensation is conducted separately for each divided frequency band based on the power of the transmit signal, the accuracy of the distortion compensation is enhanced and the distortion compensation can be conducted while reducing the effect of frequency characteristics.

In this embodiment, the amplifier of the amplifier unit 4 corresponds to the amplifier to be compensated by the present invention, the signal level detection means of the invention is constituted by the function of the power detector 5, and the distortion compensation means is constituted by the function of the multiple predistortion units PD1–PDn provided in the distortion compensator 2 and the function of the controller 6.

Further, frequency band division means of the present invention is constituted by the function of the frequency band divider 1, the frequency band combining means is constituted by the function of the frequency band combiner 3, the multiple predistortion means are constituted by the function of the multiple predistortion units PD1–PDn, and the predistortion control means is constituted by the function of the controller 6.

An amplifier device incorporating a second embodiment of the present invention will now be explained.

Figure 2:
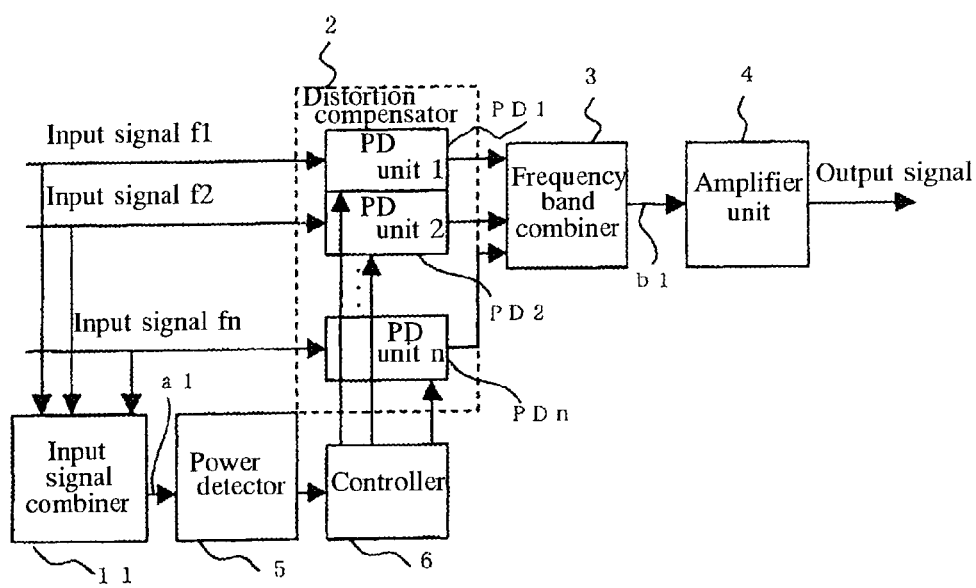
FIG. 2 is a block diagram showing the configuration of an amplifier device incorporating a second embodiment of the present invention.

FIG. 2 is a block diagram showing the configuration of the amplifier device. As constituents having the same functions as their counterparts in the first embodiment shown in FIG. 1, the amplifier device of this embodiment comprises a distortion compensator 2 having multiple predistortion units PD1–PDn, a frequency band combiner 3, an amplifier unit 4, a power detector 5 and a controller 6. It is further provided with an input signal combiner 11. The amplifier device of this embodiment is not provided with the function of the frequency band divider 1 of the first embodiment shown in FIG. 1. For convenience of explanation, constituent elements having the same functions as ones of the first embodiment shown in FIG. 1 are assigned the same reference symbols as those shown in FIG. 1. The reference symbols a1 and b1 in FIG. 2 will be used to explain another embodiment discussed later.

In the amplifier device of this embodiment, each multicarrier transmit signal to be amplified is input independently. Specifically, signals of frequency bands f1–fn are input one to each of the predistortion units PD1–PDn corresponding to the frequency bands f1–fn. In addition, all of the multiple input signals are input to the input signal combiner 11.

The input signal combiner 11, which is functionally similar to the frequency band combiner 3, combines all of the input signals and outputs the composite signal to the power detector 5. The input signal combiner 11 is constituted using a coupler or a processor capable of achieving an equivalent function by signal processing.

In this embodiment, the power detector 5 detects the power level of the composite signal received from the input signal combiner 11 and outputs the detection result to the controller 6.

In this embodiment that is input with n number of signals corresponding one each to the predistortion units PD1–PDn, the structure and operation of the distortion compensator 2, frequency band combiner 3, amplifier unit 4 and controller 6 are the same as those of their counterparts in the first embodiment.

The effect obtained when the signal to be amplified is input to the amplifier device of this embodiment as multiple signals corresponding to multiple frequency bands is the same effect as described with respect to the first embodiment.

In this embodiment, the input signal combining means of the invention is constituted by the function of the input signal combiner 11.

An amplifier device incorporating a third embodiment of the present invention will now be explained.

Figure 3:
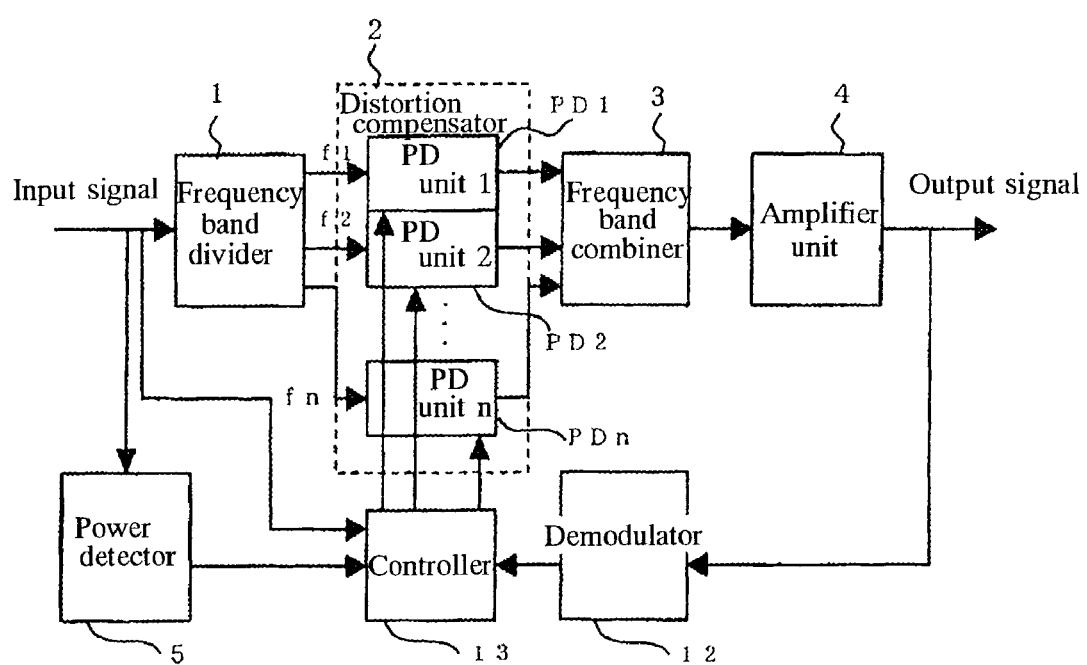
FIG. 3 is a block diagram showing the configuration of an amplifier device incorporating a third embodiment of the present invention.

FIG. 3 is a block diagram showing the configuration of the amplifier device. As constituents having the same functions as their counterparts in the first embodiment shown in FIG. 1, the amplifier device of this embodiment comprises a frequency band divider 1, a distortion compensator 2 having multiple predistortion units PD1–PDn, a frequency band combiner 3, an amplifier unit 4 and a power detector 5. It is further provided with a demodulator 12 and a controller 13 having feedback control capability. For convenience of explanation, constituent elements having the same functions as ones of the first embodiment shown in FIG. 1 are assigned the same reference symbols as those shown in FIG. 1.

In this embodiment, the multicarrier transmit signal to be amplified is input to the frequency band divider 1, the power detector 5 and the controller 13.

Part of the signal output by the amplifier unit 4 is obtained and input to the demodulator 12.

The demodulator 12 demodulates the input part of the signal to demodulate the signals corresponding to the frequency bands f1–fn of the carrier signal to be amplified and outputs the demodulation result to the controller 13.

Similarly to what was explained regarding the first embodiment, the controller 13 has a memory containing a lookup table storing signal levels sent from the power detector 5 in association with control schemes of the predistortion units PD1–PDn. The controller 13 controls the predistortion units PD1–PDn by a control scheme contained in the lookup table.

The controller 13 conducts adaptive predistortion utilizing feedback. Specifically, it compares the multicarrier signal to be amplified received from the input section of the amplifier device of this embodiment and the demodulation signal received from the demodulator 12, detects the distortion component produced in the amplifier unit 4 from the difference between the two signals, and updates the lookup table so as to reduce the detected distortion component.

The structure and operation of the frequency band divider 1, distortion compensator 2, frequency band combiner 3, amplifier unit 4 and power detector 5 are the same as those of their counterparts in the first embodiment.

The amplifier device of this embodiment provides the same effect as that of the first embodiment. In addition, it is able to adapt to change in the nonlinear characteristic of the different processing sections caused by aging, temperature change and the like.

In this embodiment, the signal demodulation means of the invention is constituted by the function of the demodulator 12, the control scheme memory means is constituted by the function of the controller 13 that stores the lookup table, the distortion detection means is constituted by the function of the controller 13 that detects the distortion produced by the amplifier unit 4, and the control scheme memory content change means is constituted by the function of the controller 13 that changes the content of the lookup table based on the distortion detection result.

An amplifier device incorporating a fourth embodiment of the present invention will now be explained.

Figure 4:
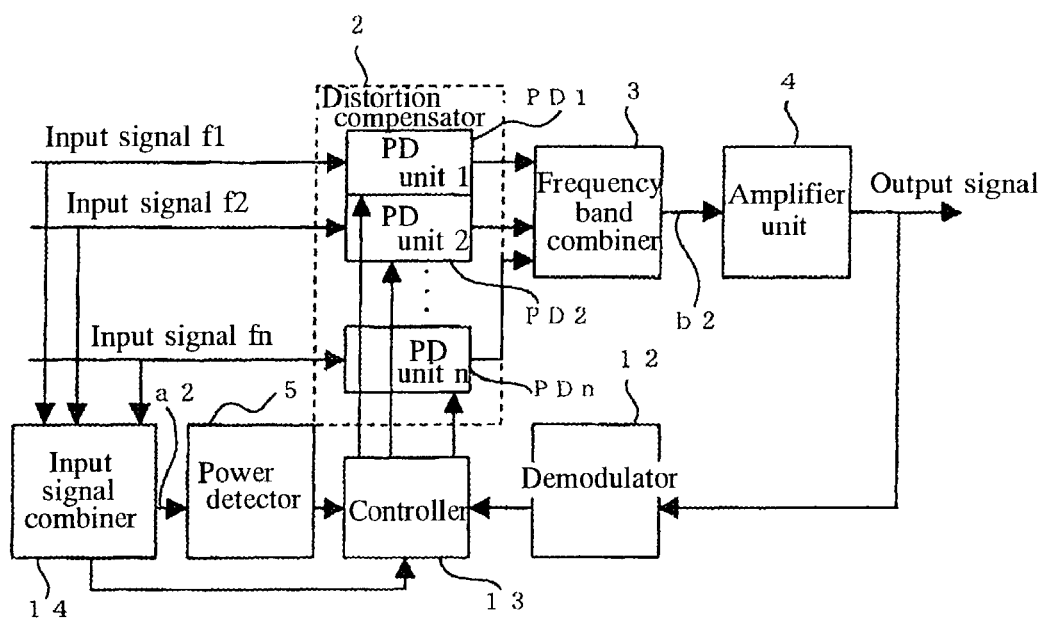
FIG. 4 is a block diagram showing the configuration of an amplifier device incorporating a fourth embodiment of the present invention.

FIG. 4 is a block diagram showing the configuration of the amplifier device. As constituents having the same functions as their counterparts in the third embodiment shown in FIG. 3, the amplifier device of this embodiment comprises a distortion compensator 2 having multiple predistortion units PD1–PDn, a frequency band combiner 3, an amplifier unit 4, a power detector 5, a demodulator 12 and a controller 13. It is further provided with an input signal combiner 14. The amplifier device of this embodiment does not include the function of the frequency band divider 1 of the third embodiment shown in FIG. 3. For convenience of explanation, constituent elements having the same functions as ones of the third embodiment shown in FIG. 3 are assigned the same reference symbols as those shown in FIG. 1. The reference symbols a2 and b2 in FIG. 4 will be used to explain another embodiment discussed later.

In the amplifier device of this embodiment, each multi-carrier transmit signal to be amplified is input independently. Specifically, signals of frequency bands f1–fn are input one to each of the predistortion units PD1–PDn corresponding to the frequency bands f1–fn. In addition, all of the multiple input signals are input to the input signal combiner 14.

The input signal combiner 14, which is functionally similar to the frequency band combiner 3, combines all of the input signals and outputs the composite signal to the power detector 5 and the controller 13. The input signal combiner 14 is constituted using a coupler or a processor capable of achieving an equivalent function by signal processing.

In this embodiment, the power detector 5 detects the power level of the composite signal received from the input signal combiner 14 and outputs the detection result to the controller 13.

The controller 13 of this embodiment detects the distortion produced in the amplifier unit 4 based on the composite signal received from the input signal combiner 14 and the demodulation signal received from the demodulator 12.

In this embodiment that is input with n number of signals corresponding one each to the predistortion units PD1–PDn, the structure and operation of the distortion compensator 2, frequency band combiner 3, amplifier unit 4 and demodulator 12 are the same as those of their counterparts in the third embodiment.

The effect obtained when the signal to be amplified is input to the amplifier device of this embodiment as multiple signals corresponding to multiple frequency bands is the same effect as described with respect to the third embodiment.

An amplifier device incorporating a fifth embodiment of the present invention will now be explained.

Figure 5:
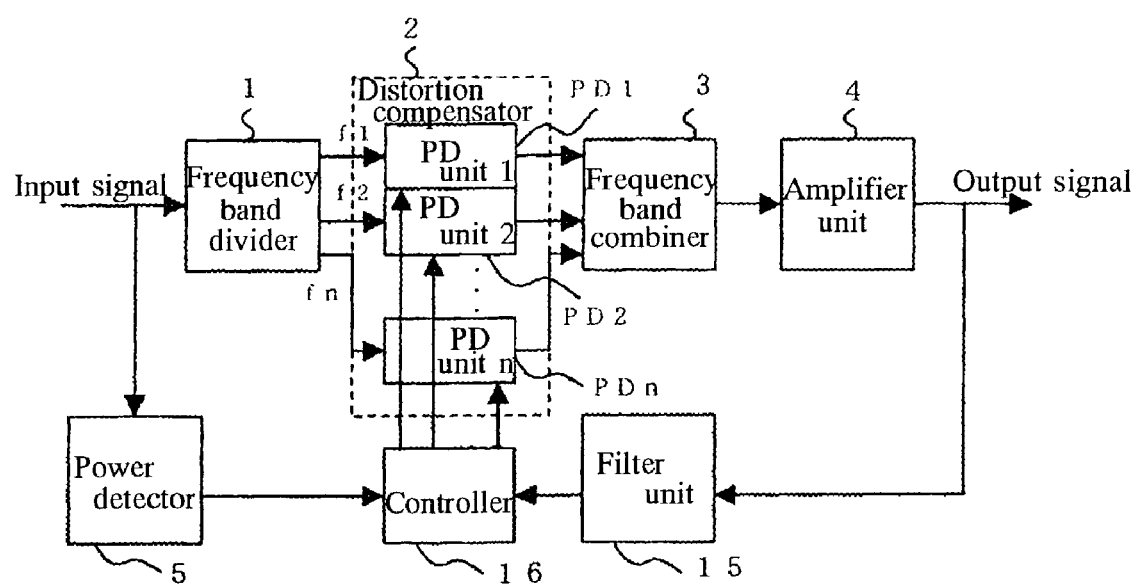
FIG. 5 is a block diagram showing the configuration of an amplifier device incorporating a fifth embodiment of the present invention.

FIG. 5 is a block diagram showing the configuration of the amplifier device. As constituents having the same functions as their counterparts in the first embodiment shown in FIG. 1, the amplifier device of this embodiment comprises a frequency band divider 1, a distortion compensator 2 having multiple predistortion units PD1–PDn, a frequency band combiner 3, an amplifier unit 4 and a power detector 5. It is further provided with a filter unit 15 and a controller 16 having feedback control capability. For convenience of explanation, constituent elements having the same functions as ones of the first embodiment shown in FIG. 1 are assigned the same reference symbols as those shown in FIG. 1.

In the amplifier device of this embodiment, part of the signal output by the amplifier unit 4 is obtained and input to the filter unit 15.

The filter unit 15 extracts from the input part of the signal only the signal in a band in which the distortion component produced in the amplifier is leaked and sends the extracted signal to the controller 16.

Similarly to what was explained regarding the first embodiment, the controller 16 has a memory containing a lookup table storing signal levels sent from the power detector 5 in association with control schemes of the predistortion units PD1–PDn. The controller 16 controls the predistortion units PD1–PDn by a control scheme contained in the lookup table.

The controller 16 conducts adaptive predistortion utilizing feedback. Specifically, the controller 16 treats the signal received from the filter unit 15 as the distortion component and updates the lookup table so as to reduce the signal (distortion component).

The structure and operation of the frequency band divider 1, distortion compensator 2, frequency band combiner 3, amplifier unit 4 and power detector 5 are the same as those of their counterparts in the first embodiment.

The amplifier device of this embodiment provides the same effect as that of the first embodiment. In addition, it is able to adapt to change in the nonlinear characteristic of the different processing sections caused by aging, temperature change and the like.

In this embodiment, the distortion extracting means of the present invention is constituted by the function of the filter unit 15 that extracts the frequency band signal containing the distortion component produced in the amplifier unit 4, the control scheme memory means is constituted by the function of the controller 16 that stores the lookup table, and the control scheme memory content change means is constituted by the function of the controller 16 that changes the content of the lookup table to reduce the distortion extracted by the filter unit 15.

An amplifier device incorporating a sixth embodiment of the present invention will now be explained.

Figure 6:
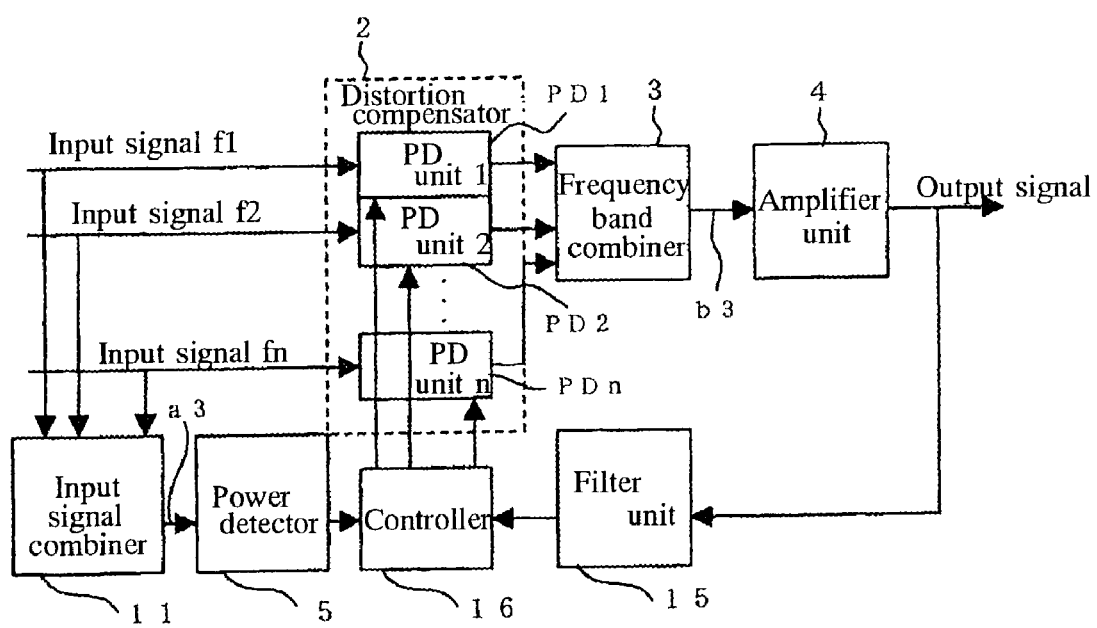
FIG. 6 is a block diagram showing the configuration of an amplifier device incorporating a sixth embodiment of the present invention.

FIG. 6 is a block diagram showing the configuration of the amplifier device. As constituents having the same functions as their counterparts in the fifth embodiment shown in FIG. 5, the amplifier device of this embodiment comprises a distortion compensator 2 having multiple predistortion units PD1–PDn, a frequency band combiner 3, an amplifier unit 4, a power detector 5, a filter unit 15 and a controller 16. As a constituent having the same function as its counterpart in the second embodiment, the amplifier device of this embodiment comprises an input signal combiner 11.

The amplifier device of this embodiment is not provided with the function of the frequency band divider 1 of the fifth embodiment shown in FIG. 5. For convenience of explanation, constituent elements having the same functions as ones of the fifth embodiment shown in FIG. 5 and the second embodiment shown in FIG. 2 are assigned the same reference symbols as those shown in FIGS. 5 and 2. The reference symbols a3 and b3 in FIG. 6 will be used to explain another embodiment discussed later.

In the amplifier device of this embodiment, each multicarrier transmit signal to be amplified is input independently. Specifically, signals of frequency bands f1–fn are input one to each of the predistortion units PD1–PDn corresponding to the frequency bands f1–fn. In addition, all of the multiple input signals are input to the input signal combiner 11.

The input signal combiner 11, which is functionally similar to the frequency band combiner 3, combines all of the input signals and outputs the composite signal to the power detector 5.

In this embodiment, the power detector 5 detects the power level of the composite signal received from the input signal combiner 11 and outputs the detection result to the controller 16.

In this embodiment that is input with n number of signals corresponding one each to the predistortion units PD1–PDn, the structure and operation of the distortion compensator 2, frequency band combiner 3, amplifier unit 4, filter unit 15 and controller 16 are the same as those of their counterparts in the fifth embodiment.

The effect obtained when the signal to be amplified is input to the amplifier device of this embodiment as multiple signals corresponding to multiple frequency bands is the same effect as described with respect to the fifth embodiment.

An amplifier device incorporating a seventh embodiment of the present invention will now be explained.

This embodiment represents an example of a configuration provided in an amplifier device in the case of conducting distortion compensation by digital predistortion. The configuration of this embodiment can be applied to any of the amplifier devices set out in the other embodiments.

Figure 7:
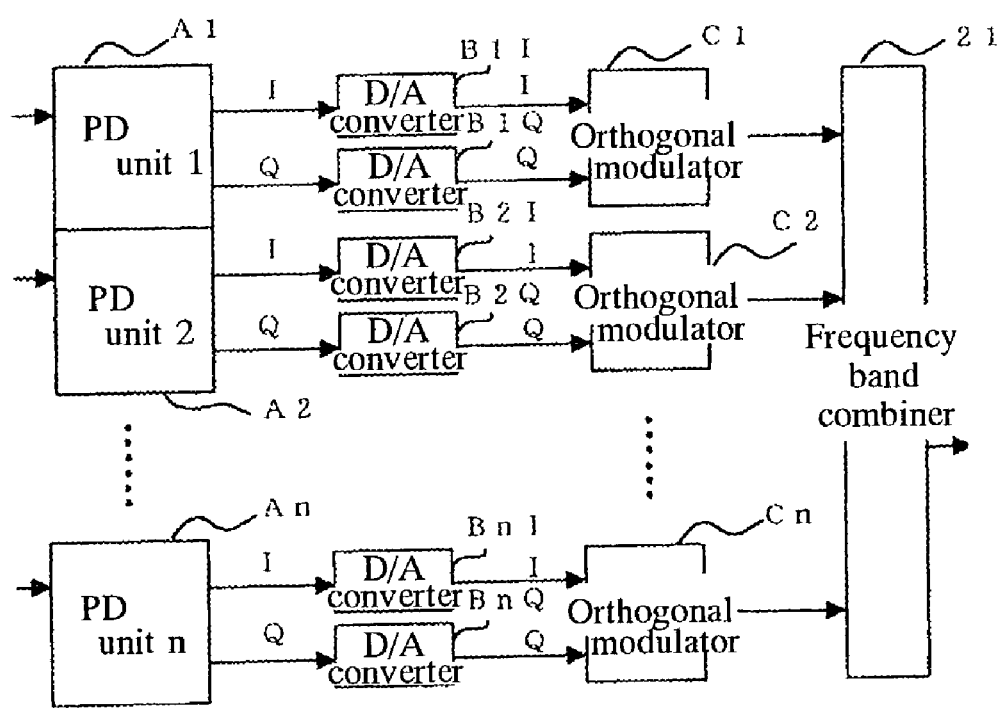
FIG. 7 is a block diagram showing one configuration of a processing unit provided when conducting digital predistortion of a seventh embodiment of the present invention.

FIG. 7 shows the configuration of the constituent section extending from a distortion compensator to a frequency band combiner provided in the amplifier device of this embodiment. This section is equipped with predistortion units A1–An and a frequency band combiner 21 and between these with D/A converters B1I–BnI for I component digital signal processing, D/A converters B1Q–BnQ for Q component digital signal processing, and orthogonal modulators C1–Cn for analog signal processing.

The predistortion units A1–An digitally process input digital signals of frequency bands f1–f2 to impart them with distortion compensation characteristics to obtain I component digital signals and Q component digital signals as digital signals imparted with the distortion. The I component digital signals are output to the I component D/A converters B1I–BnI and the Q component digital signals to the Q component D/A converters B1Q–BnQ.

The I component D/A converters B1I–BnI convert the I component digital signals received from the predistortion units A1–An to I component analog signals and output them to the orthogonal modulators C1–Cn.

Similarly, the Q component D/A converters B1Q–BnQ convert the Q component digital signals received from the predistortion units A1–An to Q component analog signals and output them to the orthogonal modulators C1–Cn.

The orthogonal modulators C1–Cn orthogonally modulate the I component analog signals received from the I component D/A converters B1I–BnI and the Q component analog signals received from the Q component D/A converters B1Q–BnQ and output the orthogonal modulation results as analog signals to the frequency band combiner 21.

The frequency band combiner 21 combines the multiple analog signals received from the orthogonal modulators C1–Cn and outputs the combination result to an amplifier section (not shown).

Figure 8:
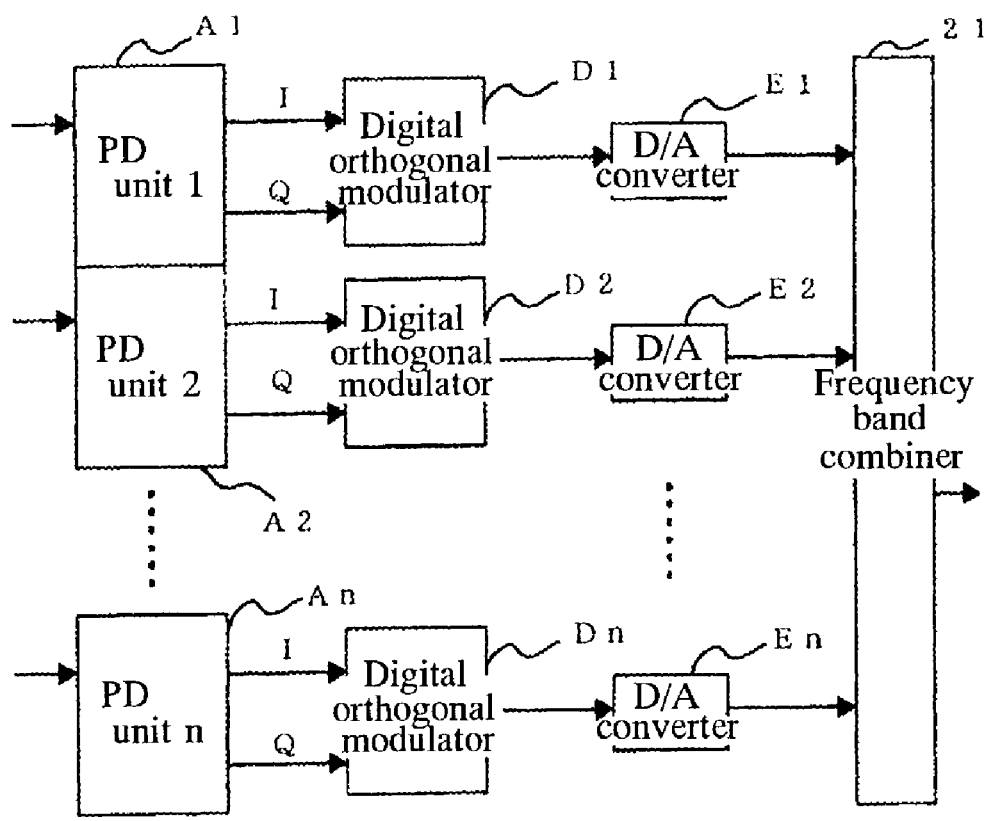
FIG. 8 is a block diagram showing another configuration of a processing unit provided when conducting digital predistortion of a seventh embodiment of the present invention.

FIG. 8 shows another configuration of the constituent section extending from the distortion compensator to the frequency band combiner provided in the amplifier device of this embodiment. Between the predistortion units A1–An and the frequency band combiner 21 of this section are provided digital orthogonal modulators D1–Dn and D/A converters E1–En. The structure and operation of the predistortion units A1–An and the frequency band combiner 21 are the same as those of their counterparts in FIG. 7. For convenience of explanation, they are assigned the same reference symbols in FIG. 8 as their counterparts in FIG. 7.

The predistortion units A1–An digitally process input digital signals of frequency bands f1–f2 to impart them with distortion compensation characteristics to obtain I component digital signals and Q component digital signals as digital signals imparted with the distortion. The I component digital signals and Q component digital signals are output to the digital orthogonal modulators D1–Dn.

The digital orthogonal modulators D1–Dn conduct digital processing for orthogonally modulating the I component digital signals and the Q component analog signals received from the predistortion units A1–An and output the orthogonal modulation results as digital signals to the D/A converters E1–En.

The D/A converters E1–En convert the digital orthogonal modulation result signals received from the digital orthogonal modulators D1–Dn to analog orthogonal modulation result signals and output them to the frequency band combiner 21.

The frequency band combiner 21 combines the analog signals received from the multiple D/A converters E1–En and outputs the combination result to the amplifier section (not shown).

The configurations shown in FIGS. 7 and 8 thus enable distortion compensation by digital predistortion.

In this embodiment, the orthogonal modulation means of the present invention is, in the configuration shown in FIG. 7, constituted by the functions of the I component D/A converters B1I–BnI, Q component D/A converters B1Q–BnQ and orthogonal modulators C1–Cn. In the configuration shown in FIG. 8, it is constituted by the functions of the digital orthogonal modulators D1–Dn and the D/A converters E1–En.

An amplifier device incorporating an eighth embodiment of the present invention will now be explained.

Figure 9:
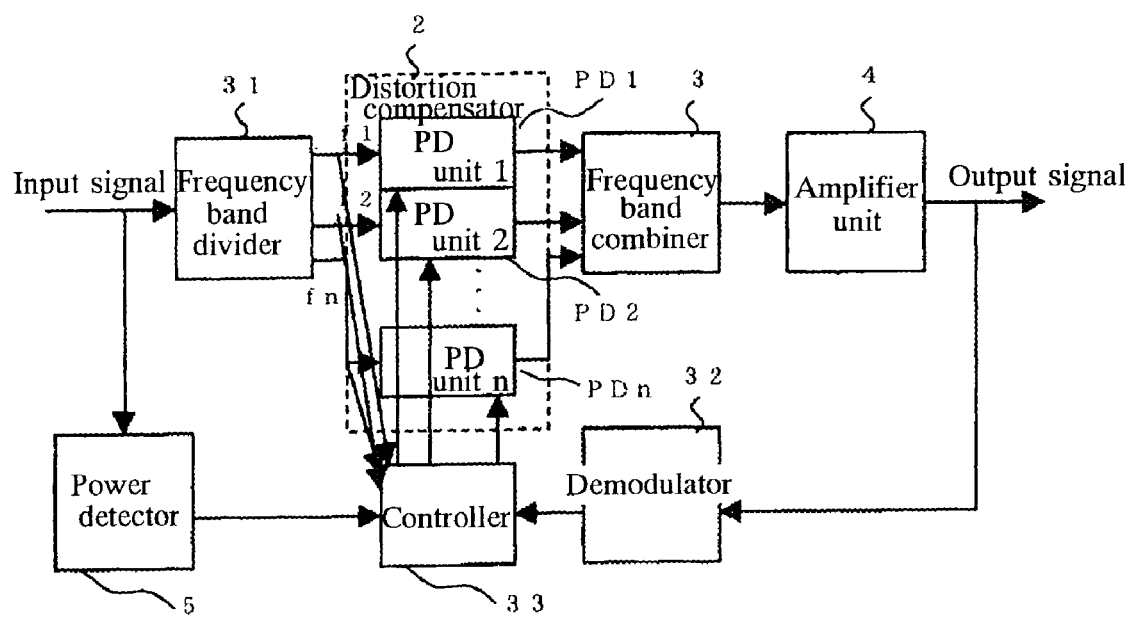
FIG. 9 is a block diagram showing the configuration of an amplifier device incorporating an eighth embodiment of the present invention.

FIG. 9 is a block diagram showing the configuration of the amplifier device. As constituents having the same functions as their counterparts in the first embodiment shown in FIG. 1, the amplifier device of this embodiment comprises a distortion compensator 2 having multiple predistortion units PD1–PDn, a frequency band combiner 3, an amplifier unit 4 and a power detector 5. It is further provided with a frequency band divider 31 whose output is sent to the distortion compensator 2 and a controller 33, a demodulator 32 capable of demodulation by individual frequency band, and the controller 33, which has feedback control capability. For convenience of explanation, constituent elements having the same functions as ones of the first embodiment shown in FIG. 1 are assigned the same reference symbols as those shown in FIG. 1.

The frequency band divider 31 divides the input transmit signal into signals of n number of frequency bands f1–fn. The signals of the divided frequency bands f1–fn are output to the predistortion units PD1–PDn corresponding to the frequency bands f1–fn. The signals of the divided frequency bands f1–fn are also output to the controller 33.

Part of the signal output by the amplifier unit 4 is obtained and input to the demodulator 32.

The demodulator 32 demodulates the input part of the signal by frequency band for each of the frequency bands f1–fn of the predistortion units PD1–PDn and outputs the demodulation result for the respective frequency bands f1–fn to the controller 33. The demodulator 32 can be constituted to have multiple demodulators corresponding to the respective frequency bands f1–fn that simultaneously demodulate the signals corresponding to the multiple frequency bands f1–fn and output the demodulation results to the controller 33. Otherwise, it can be constituted to have a single demodulator, the frequency band that the demodulator modulates be switched between frequency bands f1–fn at prescribed time intervals, and the demodulation results be output to the controller 33.

Similarly to what was explained regarding the first embodiment, the controller 33 has a memory containing a lookup table storing signal levels sent from the power detector 5 in association with control schemes of the predistortion units PD1–PDn. The controller 33 controls the predistortion units PD1–PDn by a control scheme contained in the lookup table.

The controller 33 conducts adaptive predistortion utilizing feedback. Specifically, at every frequency band f1–fn, it compares the signal to be amplified received from the frequency band divider 31 and the demodulation signal received from the demodulator 32, detects the distortion component produced in the amplifier unit 4 at every frequency band f1–fn from the difference between the signal pairs, and updates the lookup table content corresponding to every frequency band f1–fn so as to reduce the detected distortion component.

The structure and operation of the distortion compensator 2, frequency band combiner 3, amplifier unit 4 and power detector 5 are the same as those of their counterparts in the first embodiment.

The amplifier device of this embodiment provides the same effect as that of the first embodiment. In addition, it is able to adapt to change in the nonlinear characteristic of the different processing sections caused by aging, temperature change and the like. Moreover, the amplifier device of this embodiment achieves enhanced distortion compensation accuracy because, in response to the distortion compensation by predistortion conducted at the individual frequency bands f1–fn, the demodulator 32 demodulates the signal at every frequency band f1–fn and, based on the demodulation result, the controller 33 detects the distortion at every frequency band f1–fn and, based on the detection results, updates content of the lookup table corresponding to the individual frequency bands f1–fn.

An amplifier device incorporating a ninth embodiment of the present invention will now be explained.

Figure 10:
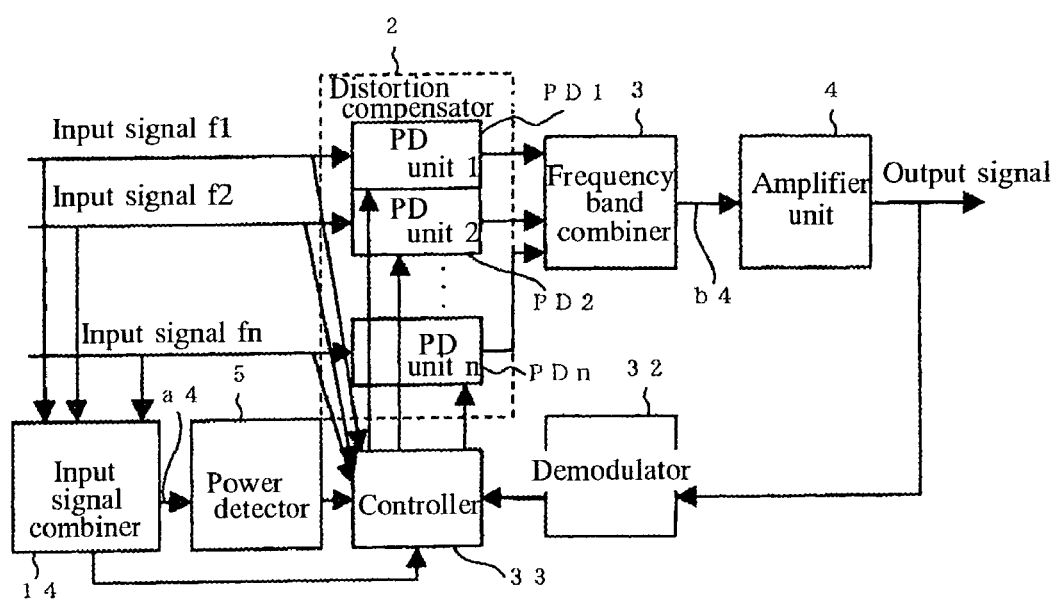
FIG. 10 is a block diagram showing the configuration of an amplifier device incorporating a ninth embodiment of the present invention.
Figure 11:
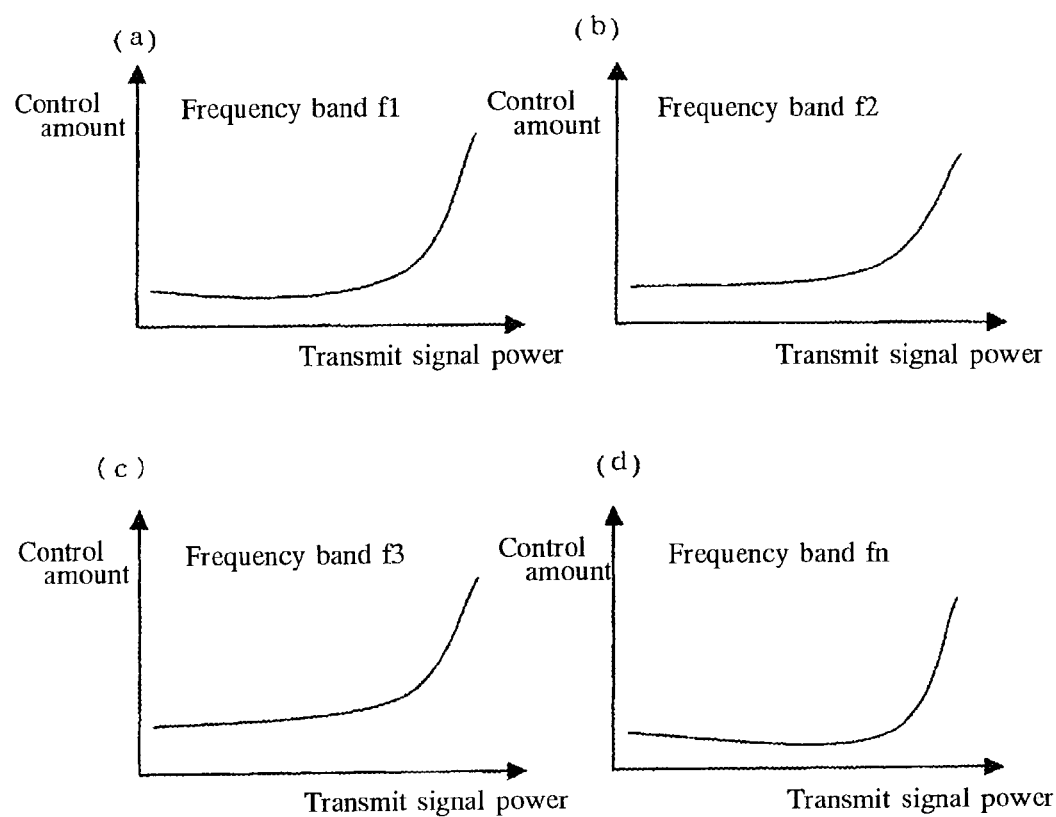
FIG. 11 is a set of graphs showing AM-AM conversion having an inverse distortion characteristic.

FIG. 10 is a block diagram showing the configuration of the amplifier device. As constituents having the same functions as their counterparts in the eighth embodiment shown in FIG. 9, the amplifier device of this embodiment comprises a distortion compensator 2 having multiple predistortion units PD1–PDn, a frequency band combiner 3, an amplifier unit 4, a power detector 5, a demodulator 32 and a controller 33. As a constituent having the same function as its counterpart in the fourth embodiment of FIG. 4, it is further provided with an input signal combiner 14.

The amplifier device of this embodiment is not provided with the function of the frequency band divider 31 of the eighth embodiment shown in FIG. 9. For convenience of explanation, constituent elements having the same functions as ones of the eighth embodiment shown in FIG. 9 and the fourth embodiment shown in FIG. 4 are assigned the same reference symbols as those shown in FIG. 9 and FIG. 4. The reference symbols a4 and b4 in FIG. 10 will be used to explain another embodiment discussed later.

In the amplifier device of this embodiment, each multi-carrier transmit signal to be amplified is input independently. Specifically, signals of frequency bands f1–fn are input one to each of the predistortion units PD1–PDn corresponding to the frequency bands f1–fn. In addition, all of the multiple input signals are input to the input signal combiner 14 and the controller 33.

The input signal combiner 14, which is functionally similar to the frequency band combiner 3, combines all of the input signals and outputs the composite signal to the power detector 5 and the controller 33.

In this embodiment, the power detector 5 detects the power level of the composite signal received from the input signal combiner 14 and outputs the detection result to the controller 33.

The controller 33 detects the distortion of each frequency band f1–fn produced in the amplifier unit 4 based on the individual signals of the frequency bands f1–fn received from the input section of the amplifier device of this embodiment and the corresponding individual demodulation signals of the frequency bands f1–fn received from the demodulator 32.

In this embodiment that is input with n number of signals corresponding one each to the predistortion units PD1–PDn, the structure and operation of the distortion compensator 2, frequency band combiner 3, amplifier unit 4 and demodulator 32 are the same as those of their counterparts in the eighth embodiment.

The effect obtained when the signal to be amplified is input to the amplifier device of this embodiment as multiple signals corresponding to multiple frequency bands is the same effect as described with respect to the eighth embodiment.

An amplifier device incorporating a tenth embodiment of the present invention will now be explained.

The general configuration of the amplifier device of this embodiment is similar to that of the fifth embodiment shown in FIG. 5. For convenience of explanation, the description of this embodiment will utilize the same reference symbols as those assigned in FIG. 5 and will focus particularly on the differences in structure and operation from the fifth embodiment.

In this tenth embodiment, the filter unit 15 extracts from the signal input thereto the distortion component produced in the amplifier unit 4 in each frequency band corresponding to the frequency bands f1–fn of the predistortion units PD1–PDn and outputs the extracted distortion components of the individual frequency bands to the controller 16. The filter unit 15 can be constituted to have multiple filters corresponding to the respective frequency bands f1–fn that simultaneously extract the distortion components corresponding to the multiple frequency bands f1–fn and output the extraction results to the controller 16. Otherwise, it can be constituted to have a single filter, the frequency band (e.g., passband) that the filter filters being switched between frequency bands f1–fn at prescribed time intervals, and the extraction results being output to the controller 16.

The frequency bands corresponding to the frequency bands f1–fn of the predistortion units PD1–PDn can be frequency bands that are on the lower frequency side relative to the carrier signals and contain many distortion components or be frequency bands that are on the higher frequency side relative to the carrier signals and contain many distortion components. Specifically, they can be frequency band portions in the frequency bands f1–fn of the predistortion units PD1–PDn other than and adjacent to the frequency band portions of the signals to be amplified (carrier signals in this embodiment) contained in the frequency bands f1–fn.

Similarly to what was explained regarding the fifth embodiment, the controller 16 has a memory containing a lookup table storing signal levels sent from the power detector 5 in association with control schemes of the predistortion units PD1–PDn. The controller 16 controls the predistortion units PD1–PDn by a control scheme contained in the lookup table.

The controller 16 of this embodiment conducts adaptive predistortion utilizing feedback. Specifically, for every frequency band f1–fn, the controller 16 updates the lookup table content corresponding to that frequency band so as to reduce the distortion component received from the filter unit 15. For example, the controller 16 of this embodiment refers to the distortion component extraction result obtained by a certain passband of the filter unit 15 and, based on this extraction result, updates the content of the lookup table related to the predistortion unit PD1–PDn corresponding to the frequency band f1–fn containing that passband or updates the content of the lookup table corresponding to a frequency band near the passband.

The structure and operation of the frequency band divider 1, distortion compensator 2, frequency band combiner 3, amplifier unit 4 and power detector 5 are the same as those of their counterparts in the fifth embodiment.

The amplifier device of this embodiment provides the same effect as that of the first embodiment. In addition, it is able to adapt to change in the nonlinear characteristic of the different processing sections caused by aging, temperature change and the like. Moreover, the amplifier device of this embodiment achieves enhanced distortion compensation accuracy because, in response to the distortion compensation by predistortion conducted at the individual frequency bands f1–fn, the filter unit 15 extracts the distortion component corresponding to every frequency band f1–fn and, based on the extraction result, the controller 16 updates content of the lookup table corresponding to the individual frequency bands f1–fn.

An amplifier device incorporating an eleventh embodiment of the present invention will now be explained.

The general configuration of the amplifier device of this embodiment is similar to that of the sixth embodiment shown in FIG. 6. For convenience of explanation, the description of this embodiment will utilize the same reference symbols as those assigned in FIG. 6 and will focus particularly on the differences in structure and operation from the sixth embodiment.

Similarly to what was explained regarding the tenth embodiment, the amplifier device of this embodiment also utilizes the filter unit 15 and the controller 16 to control the distortion compensation by the individual predistortion units PD1–PDn so as to reduce the distortion components of the individual frequency bands corresponding to the predistortion units PD1–PDn.

The structure and operation of the distortion compensator 2, frequency band combiner 3, amplifier unit 4, power detector 5 and input signal combiner 11 are the same as those of their counterparts in the sixth embodiment.

The effect obtained when the signal to be amplified is input to the amplifier device of this embodiment as multiple signals corresponding to multiple frequency bands is the same effect as described with respect to the tenth embodiment.

An amplifier device incorporating a twelfth embodiment of the present invention will now be explained.

The amplifier device of this twelfth embodiment is configured for the case where, in the amplifier device of the first, fourth, sixth, ninth or eleventh embodiment set out in the foregoing, the multiple signals corresponding to the multiple frequency bands f1–fn are input as signals in the same frequency band. Such a situation can be considered likely to arise when IF band signals or BB band signals are input and subjected to distortion compensation. The embodiment assumes input of IF band or BB band signals.

In this embodiment, the input signal combiner 11, 14 and the frequency band combiner 3 of the second embodiment shown in FIG. 2, fourth embodiment shown in FIG. 4, sixth embodiment shown in FIG. 6, ninth embodiment shown in FIG. 10 and eleventh embodiment shown in FIG. 6 are each equipped with and up-converter for converting the frequency band of input IF band or BB band signals to the RF band. The up-converter can, for instance, be constituted using and oscillator that generates a signal of a prescribed frequency, a mixer for mixing the signal of prescribed frequency and the signal to be up-converted, and a band pass filter for obtaining the up-conversion result by extracting the required frequency band signal from the mixing result.

Figure 12:
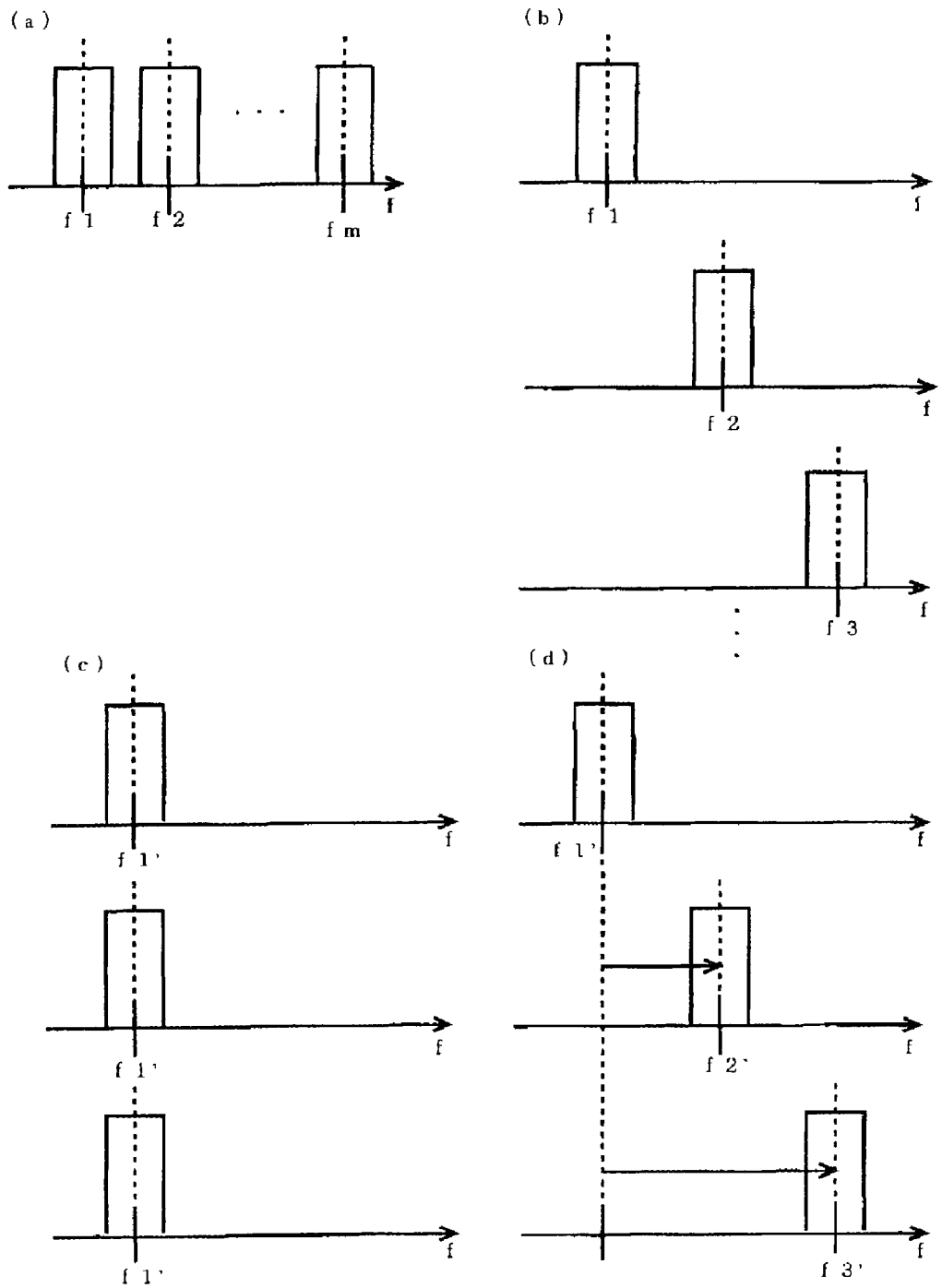
FIG. 12 is a set of graphs for explaining an example of up-conversion.
Figure 13:
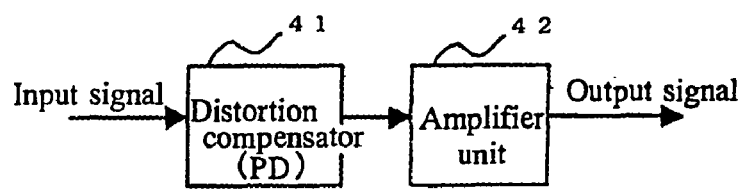
FIG. 13 is a block diagram showing a distortion-compensating transmit power amplification unit utilizing conventional predistortion.
Figure 14:
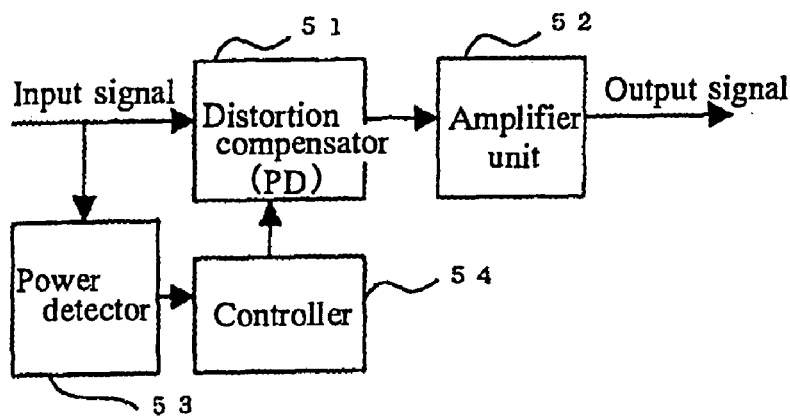
FIG. 14 is a block diagram showing a distortion-compensating transmit power amplification unit utilizing conventional predistortion.
Figure 15:
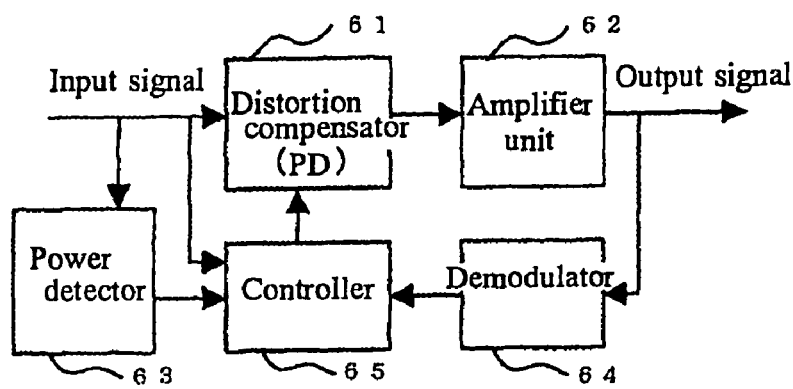
FIG. 15 is a block diagram showing a distortion-compensating transmit power amplification unit utilizing conventional predistortion.
Figure 16:
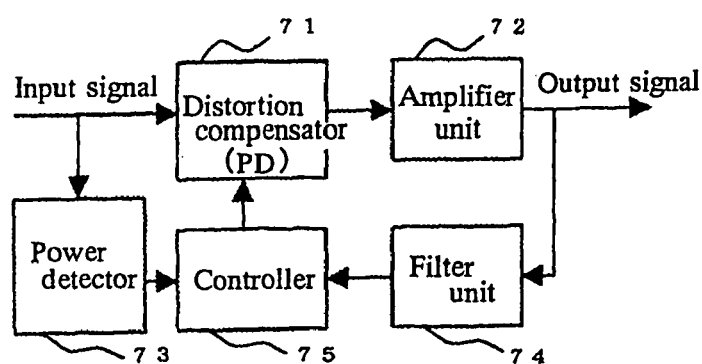
FIG. 16 is a block diagram showing a distortion-compensating transmit power amplification unit utilizing conventional predistortion.
Figure 17:
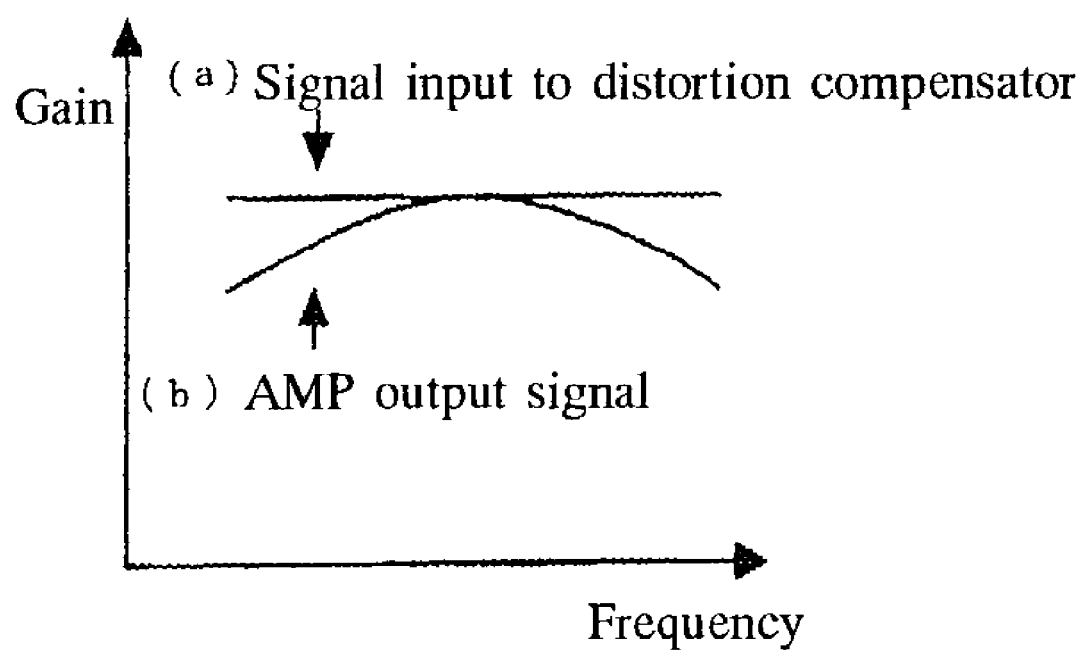
FIG. 17 is a graph showing an example of distortion compensator input and amplifier unit output frequency characteristics.

When the multiple signals corresponding to the multiple frequency bands f1–fn are input as signals in the same frequency band as in this embodiment, the frequency bands of the multiple signals need to be converted to mutually different frequency band as was explained earlier with reference to FIG. 12. The up-converter incorporates this function.

Specifically, the signal at point a1 and the signal at point b1 in FIG. 2, the signal at point a2 and the signal at point b2 in FIG. 4, the signal at point a3 and the signal at point b3 in FIG. 6, and the signal at point a4 and the signal at point b4 in FIG. 10 have to be spectral signals such as shown in FIG. 12(a) and the power detector 5 has to detect the power of the envelope of the signal amplified by the amplifier unit 4.

In this embodiment, since multiple signals corresponding to the multiple frequency bands f1–fn are input as signals in the same frequency band, the aforesaid up-converter is configured to be capable of frequency-converting these signals individually and the signals after the frequency conversion are combined. However, when multiple signals corresponding to the multiple frequency bands f1–fn are input as IF band or BB band signals having mutually different frequency bands, it is not absolutely necessary to adopt this arrangement. In such case, an arrangement can instead be adopted in which the up-converter frequency-converts the multiple signals all at one time after they are combined into a composite signal.

Another configuration of the amplifier device of this embodiment is provided for the case where IF band or BB band signals are input as signals to be amplified in the first embodiment in shown FIG. 1, third embodiment shown in FIG. 3, fifth embodiment shown in FIG. 5, eighth embodiment shown in FIG. 9 and tenth embodiment shown in FIG. 5. In this configuration, the frequency band combiner 3 shown in each of these figures is equipped with an up-converter for converting the multiple input signals to the RF band and the RF band composite signal obtained using the up-converter is output to the amplifier unit 4.

As explained in the foregoing, the amplifier device of this embodiment can achieve distortion compensation by predistortion even when multiple signals corresponding to multiple frequency bands are input as signals in the same frequency band or when the signals to be amplified are input as IF band or BB band signals. The configuration of this embodiment can also be applied when RF band signals are once down-converted to IF band signals or BB band signals that are then input to the amplifier device of this embodiment to be processed as signals to be amplified.

In this embodiment, the input signal frequency band converting means of the present invention is constituted by the function of the up-converter provided in the input signal combiner and the distortion-compensated signal frequency band converting means is constituted by the function of the up-converter provided in the frequency band combiner.

The configuration of the distortion compensator of the present invention is not limited to those set out in the foregoing and it is alternatively possible to adopt any of various other configurations.

Moreover, the present invention is not limited to the field of application described in the foregoing but can also be applied in various other fields.

The various types of processing carried out in the distortion compensator of the present invention can, for example, be conducted by physical means equipped with a processor, memory and the like wherein the processor controls the processing by executing a control program stored in a ROM (Read Only Memory). Otherwise they can be conducted by independent physical circuits constituting functional means for executing the different processing operations.

Moreover, the present invention can be construed as being constituted of the aforesaid control program or of a floppy disk, CD-ROM or other computer-readable recording medium storing the control program, and the processing according to the present invention can be carried out by loading the control program from the recording medium into a computer and executing it by use of the processor.

As explained in the foregoing, the present invention provides a distortion compensator for compensating for distortion produced in an amplifier that amplifies a signal wherein the level of the signal to amplified is detected and distortion compensation based on the detection result is conducted separately for each frequency band signal of multiple frequency band signals contained in the signal to be amplified. Therefore, even if the signal to be amplified is a wideband signal, the effect of frequency characteristics on the distortion compensation can be reduced. Moreover, since distortion compensation is conducted separately for each frequency band signal based on the overall level of the signal to be amplified, distortion compensation can be achieved with good accuracy by a simple configuration. Owing to these advantages, the distortion compensation performance is enhanced.

The present invention further provides a distortion compensator that conducts distortion compensation separately for each frequency band signal contained in the signal to be amplified based on the overall level of the signal to be amplified and utilizes adaptive predistortion using feedback to update the association between the signal level and the control scheme so as to reduce the distortion contained in the signal output by the amplifier. Accurate distortion compensation is therefore ensured even if the nonlinear characteristic of the amplifier should change owing to aging, temperature change or the like.

The present invention further provides a distortion compensator that conducts adaptive predistortion, in which the association between the signal level and the distortion compensation control scheme is changed to separately reduce the distortion component corresponding to each frequency band corresponding to each predistortion unit.

What is claimed is:

1. A distortion compensator for compensating for distortion produced in an amplifier that amplifies multiple frequency band signals, the distortion compensator comprising:
   a signal level detection means for detecting an overall level of a signal to be amplified as combined multiple frequency band signals;
   a distortion compensation means for conducting different distortion compensation based on the detection result separately for each frequency band signal in the signal to be amplified; and
   a frequency band combining means for combining multiple frequency band signals compensated by the distortion compensation means and outputting the combination result to the amplifier,
   wherein the distortion compensation means includes a plurality of predistortion means for generating distortion for each frequency band signal and predistortion control means for controlling generation of distortion by the plurality of predistortion means based on the detection result of the signal level detection means, and
   wherein the frequency band combining means includes signal frequency band converting means for converting each of the distortion-compensated frequency band signals compensated by the distortion compensation means to a different frequency band signal, combining the multiple different frequency band signals obtained by the conversion and outputting the combination result to the amplifier.

2. A distortion compensator according to claim 1, wherein the distortion compensation means is operable to conduct distortion compensation based only on the overall level detected by the signal level detection means.

3. A distortion compensator for compensating for distortion produced in an amplifier that amplifies a signal, the distortion compensator comprising:
   a signal level detection means for detecting a level of a signal to be amplified;
   distortion compensation means for conducting distortion compensation based on the detection result separately for each frequency band signal of multiple frequency band signals contained in the signal to be amplified;
   frequency band division means for dividing the signal to be amplified into the multiple frequency band signals; and
   frequency band combining means for combining the multiple frequency band signals compensated for distortion by the distortion compensation means and outputting the combination result to the amplifier,
   wherein the signal level detection means is operable to detect the level of an input signal for amplification and the distortion compensation means includes multiple predistortion means for generating distortion for each frequency band signal divided by the frequency band division means and predistortion control means for controlling generation of distortion by the multiple predistortion means based on the detection result of the signal level detection means, and
   wherein the frequency band combining means includes distortion-compensated signal frequency band converting means for converting each of the frequency band signals distortion-compensated by the distortion compensation means to a different frequency band signal, combining the multiple different frequency band signals obtained by the conversion and outputting the combination result to the amplifier.

4. A distortion compensator according to claim 3, further comprising:
   orthogonal modulation means for orthogonal modulating signals,
   wherein each of the multiple predistortion means is operable to output, as signals imparted with distortion, a digital signal having an I component and a digital signal having a Q component, the orthogonal modulation means is operable to generate from the I component digital signal and the Q component digital signal output by each of the multiple predistortion means an analog signal constituting the result of orthogonal modulation, and the frequency band combining means is operable to acquire the combination result with respect to the multiple analog signals corresponding to the multiple predistortion means generated by the orthogonal modulation means and output the combination result to the amplifier.

5. A distortion compensator according to claim 3, further comprising:
   signal demodulation means for demodulating from a signal output by the amplifier a signal corresponding to the signal to be amplified,
   wherein the predistortion control means includes control scheme memory means for storing a signal level and a control scheme of the multiple predistortion means in association with each other, the predistortion control means is operable to control generation of distortion by the multiple predistortion means in a control scheme associated with the detection result of the signal level detection means based on content of the control scheme memory means, and the predistortion control means further includes distortion detection means for detecting distortion produced in the amplifier from the signal to be amplified and the signal demodulated by the signal demodulation means and control scheme memory content change means for changing the content of the control scheme memory means to reduce the distortion detected by the distortion detection means.

6. A distortion compensator according to claim 5, wherein:
   the signal demodulation means is operable to separately demodulate the frequency band signal corresponding to each predistortion means,
   the distortion detection means is operable to detect the distortion produced in the amplifier with respect to each frequency band signal demodulated by the signal demodulation means, and
   the control scheme memory content change means is operable to separately change a portion of the content stored in the control scheme memory means corresponding to each frequency band signal demodulated by the signal demodulation means.

7. A distortion compensator according to claim 3, further comprising:
   distortion extracting means for extracting distortion produced in the amplifier from a signal output by the amplifier,
   wherein the predistortion control means includes control scheme memory means for storing a signal level and a control scheme of the multiple predistortion means in association with each other, the predistortion control means is operable to control generation of distortion by the multiple predistortion means in a control scheme associated with the detection result of the signal level detection means based on content of the control scheme memory means, and the predistortion control means further includes control scheme memory content change means for changing the content of the control scheme memory means to reduce the distortion extracted by the distortion extracting means.

8. A distortion compensator according to claim 7, wherein:
the distortion extracting means is operable to separately extract the distortion of a frequency band corresponding to each predistortion means, and
the control scheme memory content change means is operable to separately change a portion of the content stored in the control scheme memory means corresponding to the distortion of each frequency band extracted by the distortion extracting means so as to reduce the distortion of each frequency band.

9. A distortion compensator for compensating for distortion produced in an amplifier that amplifies a signal, the distortion compensator comprising:
a signal level detection means for detecting a level of a signal to be amplified;
distortion compensation means for conducting distortion compensation based on the detection result separately for each frequency band signal of multiple frequency band signals contained in the signal to be amplified;
input signal combining means for combining multiple signals corresponding to multiple frequency bands input for amplification; and
frequency band combining means for combining multiple signals corresponding to the multiple frequency bands distortion-compensated by the distortion compensation means and outputting the combination result to the amplifier,
wherein the signal level detection means is operable to detect the level of the combination result signal produced by the input signal combining means, and the distortion compensation means includes multiple predistortion means for generating distortion for each frequency band signal corresponding to a frequency band input for amplification and predistortion control means for controlling generation of distortion by the multiple predistortion means based on the detection result of the signal level detection means, and
wherein:
the multiple signals corresponding to the multiple frequency bands input for amplification are input as same frequency band signals,
the input signal combining means includes input signal frequency band converting means for converting the signal corresponding to each frequency band to a different frequency and combining the multiple frequency band signals obtained by the conversion, and
the frequency band combining means includes distortion-compensated signal frequency band converting means for converting the frequency band signal corresponding to each frequency band compensated for distortion by the distortion compensation means to a different frequency band signal, combining the multiple different frequency band signals obtained by the conversion and outputting the combination result to the amplifier.

10. A distortion compensator according to claim 9, further comprising:
orthogonal modulation for orthogonal modulating signals, wherein each of the multiple predistortion means is operable to output, as signals imparted with distortion, a digital signal having an I component and a digital signal having a Q component, the orthogonal modulation means is operable to generate from the I component digital signal and the Q component digital signal output by each of the multiple predistortion means an analog signal constituting the result of orthogonal modulation, and the frequency band combining means is operable to acquire the combination result with respect to the multiple analog signals corresponding to the multiple predistortion means generated by the orthogonal modulation means and output the combination result to the amplifier.

11. A distortion compensator according to claim 9, further comprising:
signal demodulation means for demodulating from a signal output by the amplifier a signal corresponding to the signal to be amplified,
wherein the predistortion control means includes control scheme memory means for storing a signal level and a control scheme of the multiple predistortion means in association with each other, the predistortion control means is operable to control generation of distortion by the multiple predistortion means in a control scheme associated with the detection result of the signal level detection means based on content of the control scheme memory means, and the predistortion control means further includes distortion detection means for detecting distortion produced in the amplifier from the signal to be amplified and the signal demodulated by the signal demodulation means and control scheme memory content change means for changing the content of the control scheme memory means to reduce the distortion detected by the distortion detection means.

12. A distortion compensator according to claim 11, wherein:
the signal demodulation means is operable to separately demodulate the frequency band signal corresponding to each predistortion means,
the distortion detection means is operable to detect the distortion produced in the amplifier with respect to each frequency band signal demodulated by the signal demodulation means, and
the control scheme memory content change means is operable to separately change a portion of the content stored in the control scheme memory means corresponding to each frequency band signal demodulated by the signal demodulation means.

13. A distortion compensator according to claim 9, further comprising:
distortion extracting means for extracting distortion produced in the amplifier from a signal output by the amplifier,
wherein the predistortion control means includes control scheme memory means for storing a signal level and a control scheme of the multiple predistortion means in association with each, the predistortion control means is operable to control generation of distortion by the multiple predistortion means in a control scheme associated with the detection result of the signal level detection means based on content of the control scheme memory means, and the predistortion control means further includes control scheme memory content change means for changing the content of the control scheme memory means to reduce the distortion extracted by the distortion extracting means.

14. A distortion compensator according to claim 13, wherein:

the distortion extracting means is operable to separately extract the distortion of the frequency band corresponding to each predistortion means, and the control scheme memory content change means is operable to separately change a portion of the content stored in the control scheme memory means corresponding to the distortion of each frequency band extracted by the distortion extracting means so as to reduce the distortion of each frequency band.

* * * * *